(12) United States Patent
Won et al.

(10) Patent No.: US 11,678,516 B2
(45) Date of Patent: Jun. 13, 2023

(54) DISPLAY PANEL AND DISPLAY APPARATUS INCLUDING THE SAME

(71) Applicant: SAMSUNG DISPLAY CO., LTD., Yongin-si (KR)

(72) Inventors: Byeonghee Won, Yongin-si (KR); Jaemin Shin, Yongin-si (KR); Sangwoo Kim, Yongin-si (KR); Jongho Hong, Yongin-si (KR)

(73) Assignee: SAMSUNG DISPLAY CO., LTD., Gyenonggi-do (KR)

( * ) Notice: Subject to any disclaimer, the term of this patent is extended or adjusted under 35 U.S.C. 154(b) by 215 days.

(21) Appl. No.: 17/147,873

(22) Filed: Jan. 13, 2021

(65) Prior Publication Data

US 2021/0376006 A1 Dec. 2, 2021

(30) Foreign Application Priority Data

Jun. 1, 2020 (KR) .................. 10-2020-0066024

(51) Int. Cl.
*H01L 27/32* (2006.01)
(52) U.S. Cl.
CPC ........ *H01L 27/326* (2013.01); *H01L 27/3276* (2013.01)
(58) Field of Classification Search
CPC .................................................. H01L 27/326
See application file for complete search history.

(56) References Cited

U.S. PATENT DOCUMENTS

| 9,865,834 | B2 | 1/2018 | Kanda et al. |
| 10,147,777 | B2 | 12/2018 | Lim et al. |
| 2014/0218971 | A1* | 8/2014 | Wu ............ H01L 27/326 362/613 |
| 2015/0138041 | A1* | 5/2015 | Hirakata ........ H01L 27/3262 345/1.3 |
| 2017/0162821 | A1* | 6/2017 | Oh ............. H01L 27/323 |
| 2018/0052493 | A1* | 2/2018 | Hong ............ G06F 3/0412 |

(Continued)

FOREIGN PATENT DOCUMENTS

| CN | 110288945 A | 9/2019 |
| KR | 101446298 B1 | 10/2014 |

(Continued)

OTHER PUBLICATIONS

Extended European Search Report for Application No. 21164110.5 dated Sep. 9, 2021.

*Primary Examiner* — Douglas M Menz

(74) *Attorney, Agent, or Firm* — Cantor Colburn LLP

(57) ABSTRACT

A display panel includes a substrate, a first display area including first pixels, a second display area located at a corner of the first display area and including second pixels, a third display area located between the first display area and the second display area and including third pixels, first display units, second display units, and third display units, which are disposed on the substrate and correspond to the first to third pixels, respectively, and a driver which provides the first to third display units with an electrical signal, and having a portion of which overlaps the third pixels. Slits cut in a direction toward a corner of the substrate from an inner side of the substrate is defined in the substrate at the corner thereof, and the substrate includes a strip portion between two adjacent slits.

25 Claims, 20 Drawing Sheets

(56) References Cited

U.S. PATENT DOCUMENTS

| | | |
|---|---|---|
| 2019/0108793 A1 | 4/2019 | Kim et al. |
| 2019/0341433 A1 | 11/2019 | Im et al. |
| 2019/0347989 A1 | 11/2019 | Lee et al. |
| 2020/0176696 A1 | 6/2020 | Dai |

FOREIGN PATENT DOCUMENTS

| | | |
|---|---|---|
| KR | 101820593 B1 | 1/2018 |
| KR | 1020180018960 A | 2/2018 |
| KR | 1020190126955 A | 11/2019 |
| WO | 2019223776 A1 | 11/2019 |

\* cited by examiner

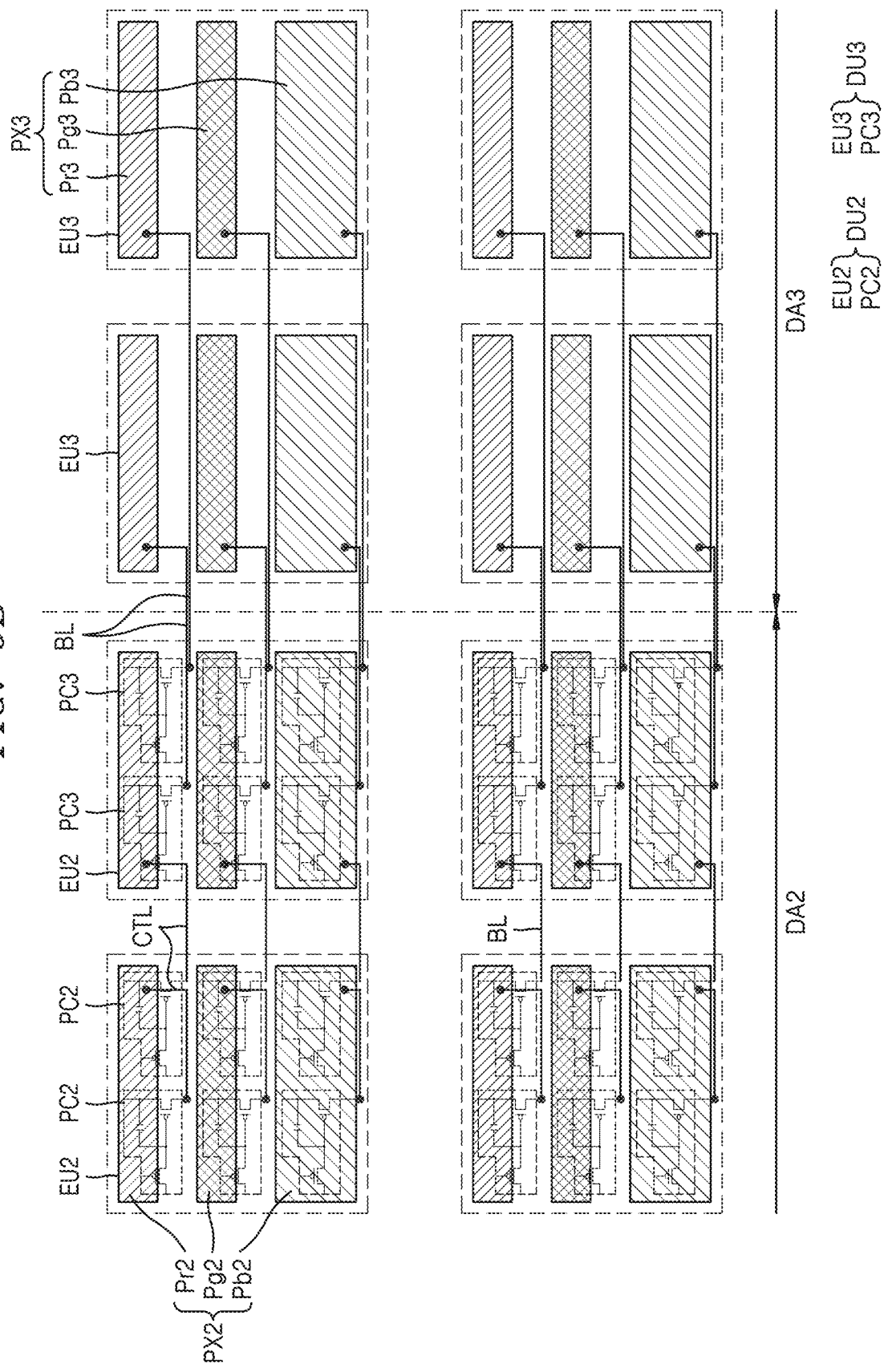

DISPLAY PANEL AND DISPLAY APPARATUS INCLUDING THE SAME

This application claims priority to Korean Patent Application No. 10-2020-0066024, filed on Jun. 1, 2020, and all the benefits accruing therefrom under 35 U.S.C. § 119, the content of which in its entirety is herein incorporated by reference.

BACKGROUND

1. Field

One or more embodiments relate to a display apparatus, and more particularly, to a display apparatus having an expanded display area.

2. Description of Related Art

Display apparatuses display an image corresponding to image data. A display apparatus typically includes scan lines and data lines, which are insulated from each other, and a plurality of pixels. In addition, a display apparatus may include a pixel circuit including thin-film transistors and a storage capacitor, where the pixel circuit corresponds to each of the plurality of pixels. A peripheral area may include various wires configured to transmit an electrical signal to the pixel circuit of a display area, a scan driver, a data driver, and a controller. The peripheral area may be a non-display area that may not display an image visually.

The display apparatuses are widely used in various fields. The display apparatus have become thinner and lighter, such that a range of use thereof has expanded. In addition, efforts have been made to reduce an area of the non-display area and increase an area of the display area.

SUMMARY

One or more embodiments include a display apparatus in which a non-display area is reduced and a display area is increased.

According to an embodiment, a display panel includes a substrate; a first display area including a plurality of first pixels; a second display area located at a corner of the first display area and including a plurality of second pixels; a third display area located between the first display area and the second display area and including a plurality of third pixels; a plurality of first display units, a plurality of second display units, and a plurality of third display units, which are disposed on the substrate and correspond to the first to third pixels, respectively, and a driver which provides the first to third display units with an electrical signal, and having a portion of which overlaps the third pixels. In such an embodiment, a plurality of slits cut in a direction toward a corner of the substrate from an inner side of the substrate is defined in the substrate at the corner thereof, and the substrate includes a strip portion between two adjacent slits among the slits.

In an embodiment, the second pixels may be disposed on the strip portion.

In an embodiment, a distance between the second pixels may be changeable by a force applied to the second display area.

In an embodiment, a portion of the substrate in the second display area may include a base, and a plurality of connectors extending from the base in different directions from each other.

In an embodiment, the second pixels may be disposed on the base.

In an embodiment, each of the first to third display units may include a light-emitting diode, and a pixel circuit electrically connected to the light-emitting diode, where the pixel circuit may include a transistor and a storage capacitor. In such an embodiment, the pixel circuit of a third display unit among the third display units may be in the first display area or the second display area.

In an embodiment, the display panel may further include a bridge line connecting the pixel circuit of a third display unit to a light-emitting diode of the third display unit, and the bridge line may extend toward the third display area from the first display area or the second display area.

In an embodiment, the light-emitting diode of a first display unit from among the first display units or a light-emitting diode of a second display unit from among the second display units may overlap a portion of the pixel circuit of the third display unit.

In an embodiment, each of the first to third display units may include a light-emitting diode, and a pixel circuit electrically connected to the light-emitting diode, where the pixel circuit may include a transistor and a storage capacitor. In such an embodiment, the pixel circuit of a first third display unit among the third display units may be in the first display area, and the pixel circuit of a second third display unit among the third display units may be in the second display area.

In an embodiment, the light-emitting diode of the first third display unit may be disposed in an area adjacent to the first display area in the third display area, and the light-emitting diode of the second third display unit may be disposed in an area adjacent to the second display area in the third display area.

In an embodiment, the display panel may further include a first bridge line connecting the pixel circuit of the first third display unit to the light-emitting diode of the first third display unit and a second bridge line connecting the pixel circuit of the second third display unit to the light-emitting diode of the second third display unit, and the first bridge line and the second bridge line may extend toward the third display area from the first display area and the second display area, respectively.

In an embodiment, the light-emitting diode of a first display unit among the first display units may include a portion overlapping the pixel circuit of the first third display unit, and the light-emitting diode of a second display unit among the second display units may include a portion overlapping the pixel circuit of the second third display unit.

According to an embodiment, a display apparatus includes a substrate, a first display area which includes a plurality of first light-emitting elements and is partially bent, a second display area which includes a plurality of second light-emitting elements and is spaced apart from the first display area, a driver between the first display area and the second display area, and a third display area including a plurality of third light-emitting elements disposed on the driver.

In an embodiment, the first display area may include a front display area, a first side display area adjacent to a first edge of the front display area, and a second side display area adjacent to a second edge of the front display area, where the third display area may be adjacent to a corner of the front display area, the first side display area, and the second side display area.

In an embodiment, a plurality of slits cut in a direction toward a corner of the substrate from an inner side of the substrate is defined in the substrate, and the substrate may include a strip portion between two adjacent slits among the slits.

In an embodiment, the second light-emitting elements may be disposed on the strip portion.

In an embodiment, a portion of the substrate in the second display area may include a base, and a plurality of connectors extending from the base in different directions from each other.

In an embodiment, the second light-emitting elements may be disposed on the base.

In an embodiment, the display apparatus may further include a plurality of first pixel circuits, a plurality of second pixel circuits, and a plurality of third pixel circuits, which are connected to the first to third light-emitting elements, respectively, and each of which includes a transistor and a storage capacitor. In such an embodiment, the third pixel circuits may be disposed in the first display area or the second display area.

In an embodiment, one third pixel circuit of the third pixel circuits may be disposed in the first display area, and another third pixel circuit of the third pixel circuits may be disposed in the second display area.

In an embodiment, a distance between the second light-emitting elements may be the same as a distance between the third light-emitting elements.

In an embodiment, on a plane, an area of an emission area of a second light-emitting element among the second light-emitting elements may be the same as an area of an emission area of a third light-emitting element among the third light-emitting elements.

In an embodiment, on a plane, each of the area of an emission area of a second light-emitting element among the second light-emitting elements and the area of an emission area of a third light-emitting element among the third light-emitting elements may be greater than an area of an emission area of a first light-emitting element among the first light-emitting elements.

In an embodiment, the display apparatus may further include a window disposed above the substrate and covering the first to third light-emitting elements.

According to embodiments of the invention, a display apparatus, in which a display area is expandable to a corner portion and an area of the display area is increased, may be realized.

BRIEF DESCRIPTION OF THE DRAWINGS

The above and other features of embodiments of the disclosure will be more apparent from the following description taken in conjunction with the accompanying drawings, in which:

FIGS. 9A to 9C are each a schematic top plan view of arrangement of a pixel circuit and a light-emitting element of a display apparatus, according to embodiments.

DETAILED DESCRIPTION

Figure 1:
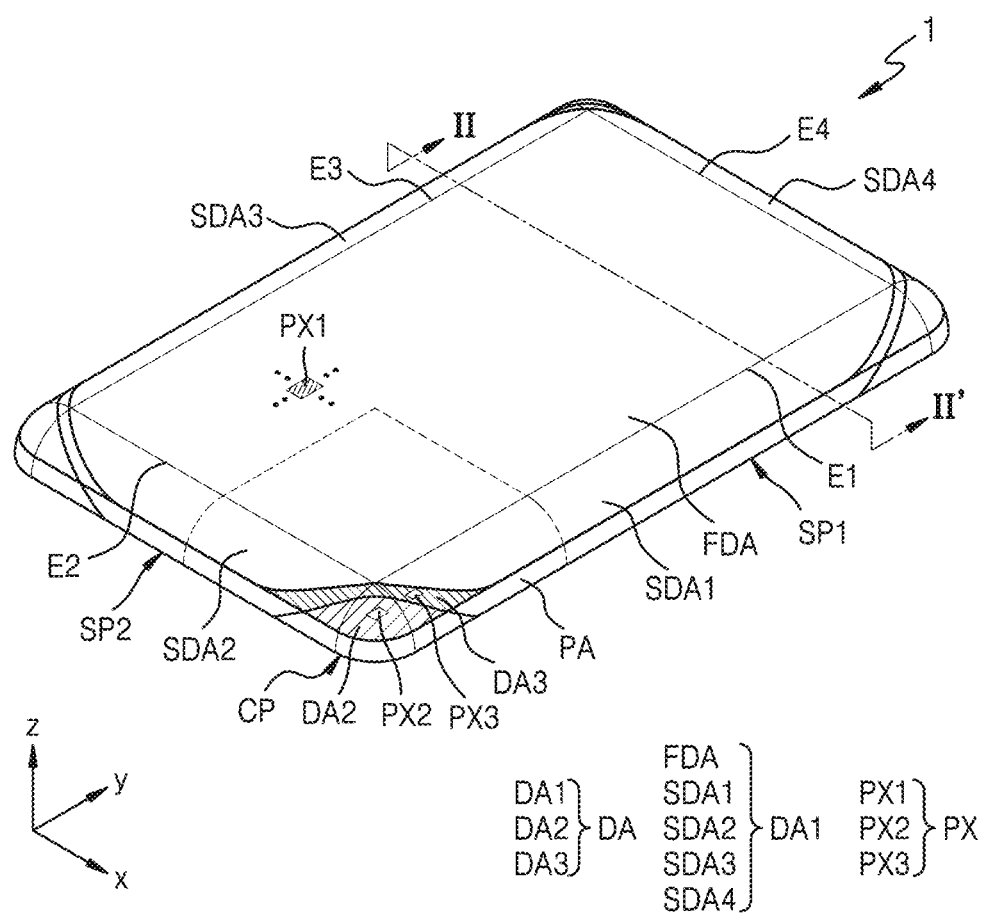
FIG. 1 is a schematic perspective view of a display apparatus, according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

As the disclosure allows for various changes and numerous embodiments, particular embodiments will be illustrated in the drawings and described in detail in the written description. Hereinafter, effects and features of the disclosure and a method for accomplishing them will be described more fully with reference to embodiments and drawings described below in detail. This disclosure may, however, be embodied in many different forms and should not be construed as limited to the embodiments set forth herein.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present.

Sizes of elements in the drawings may be exaggerated for convenience of explanation. For example, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or may be performed in an order opposite to the described order.

In the present specification, the expression "A and/or B" represents A, B, or A and B. In addition, the expression "at least one of A and B" represents A, B, or A and B.

It will be understood that when a layer, region, or element is referred to as being "connected to" another layer, area, or element, it can be directly and/or indirectly connected to the other layer, region, or element. That is, for example, intervening layers, regions, or elements may be present. For example, it will be understood that when a layer, region, or element is referred to as being "electrically connected to" another layer, area, or element, it can be directly and/or indirectly electrically connected to the other layer, region, or element. That is, for example, intervening layers, regions, or elements may be present.

The x-axis, the y-axis, and the z-axis shown in the drawings are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, embodiments of the disclosure will now be described in detail with reference to the accompanying drawings.

FIG. 1 is a schematic perspective view of a display apparatus 1, according to an embodiment.

Referring to FIG. 1, an embodiment of the display apparatus 1 may include a display area DA and a peripheral area PA located at an outer side of the display area DA. The display area DA may include a first display area DA1, a second display area DA2, and a third display area DA3. The display apparatus 1 may provide an image through an array of a plurality of pixels PX disposed (e.g., arranged) in the display area DA. The plurality of pixels PX may be disposed in the first to third display areas DA1, DA2, and DA3. In one embodiment, for example, the first to third display areas DA1, DA2, and DA3 may include first to third pixels PX1, PX2, and PX3, respectively.

The display apparatus 1 may provide first to third images by using light emitted by the pixels PX respectively disposed in the first to third display areas DA1, DA2, and DA3. In an embodiment, the first to third images may be portions of an image provided through the display area DA of the display apparatus 1. In an embodiment, the display apparatus 1 may provide the first to third images that are independent from one another.

In an embodiment, as shown in FIG. 1, the display apparatus 1 may have a rectangular shape on a plane, and a corner portion CP thereof may be round, but embodiments are not limited thereto. Herein, the phrase "on a plane" means "when viewed from a plan view in a thickness direction of the display apparatus or a z-axis direction." The display apparatus 1 may have various shapes such as a polygon including a triangle and a rectangle, a circle, or an oval. Hereinafter, for convenience of description, embodiments where the display apparatus 1 has a rectangular shape with the round corner portion CP on a plane will now be described in detail.

The first display area DA1 may include a front display area FDA having a rectangular shape on a plane, and a first side display area SDA1, a second side display area SDA2, a third side display area SDA3 and a fourth side display area SDA4, which are adjacent to first to fourth edges E1, E2, E3, and E4 of the front display area FDA, respectively. The first display area DA1 may be partially bent. In an embodiment, the front display area FDA of the first display area DA1 may be flat, and each of the first to fourth side display areas SDA1, SDA2, SDA3, and SDA4 may be bent or curved with a constant curvature. Curvatures of the first to fourth side display areas SDA1, SDA2, SDA3, and SDA4 may be to the same as or different from each other. The first display area DA1 may be partially bent to improve the aesthetic sensibility of the display apparatus 1.

The second display area DA2 may be disposed at a corner of the first display area DA1, and may be apart from the first display area DA1. The third display area DA3 may be between the first display area DA1 and the second display area DA2. The third display area DA3 may be adjacent to a corner of the front display area FDA of the first display area DA1, the first side display area SDA1, and/or the second side display area SDA2, and may also be adjacent to the second display area DA2. In an embodiment, the display apparatus 1 may include four second display areas DA2 and/or four third display areas DA3.

The peripheral area PA may be a non-display area that is configured not to provide an image. The peripheral area PA may entirely or partially surround the display area DA. A driver configured to provide the pixels PX with an electrical signal or power may be disposed in the peripheral area PA. A pad, to which electronic devices, printed circuit boards, or the like may be electrically connected, may be disposed in the peripheral area PA. The driver may also be disposed in the third display area DA3.

In an embodiment, each of four side portions of the display apparatus 1 may be bent or curved to have a curved surface having a constant curvature and facing a different direction, one from another. In one embodiment, for example, a first side portion SP1 of four side portions may have a curved surface facing a direction lying in a plane (i.e., an xz plane) formed by an x-axis direction and the z-axis direction, and a second side portion SP2 of four side portions may have a curved surface facing a direction lying in a plane (i.e., a yz plane) formed by a y-axis direction and the z-axis direction.

Each of four corner portions CP of the display apparatus 1 may be between two side portions SP1 and SP2 adjacent to each other, and may be adjacent to the two side portions SP1 and SP2 which are bent to have different curved surfaces. The corner portion CP connects the two side portions SP1 and SP2 to each other, and a curved surface of the corner portion CP may include curved surfaces which face various directions and are continuously connected to each other. In such corner portions CP, a partial area of elements placed in the corner portion CP of the display apparatus 1 may be contracted, and the other partial area thereof may be stretched.

In an embodiment, as described above, because the elements placed in the corner portion CP may be both contracted and stretched, it may be difficult to arrange a pixel PX or a driver in the corner portion CP. In a conventional display apparatus, a driver and a pixel may be disposed apart from a corner portion thereof, and thus the corner portion is a non-display area.

In embodiments of the invention, the pixels PX may be disposed in the corner portion CP such that a non-display area may be reduced and a display area may be expanded. In such an embodiment, the pixels PX may also be allowed to be disposed stably in an area in which a driver is disposed such that the display area may be expanded.

In an embodiment, the display apparatus 1 may be an apparatus including a display element, for example, mobile phones, tablet personal computers, wrist-wearable smart watches or wrist-wearable smart bands, and electronic apparatuses for vehicles.

In such an embodiment, the display apparatus 1 is an apparatus configured to display an image and may be, for example, a liquid crystal display, an electrophoretic display, an organic light-emitting display, an inorganic light-emitting display, an organic/inorganic composite light-emitting display, a quantum dot display, a field emission display, a surface-conduction electron-emitter display, a plasma display, or a cathode-ray tube display.

Hereinafter, for convenience of description, embodiments where the display apparatus 1 is an organic light-emitting display will be described in detail, but not being limited thereto. Alternatively, the display apparatus 1 may be one of other various types of display.

Figure 2:
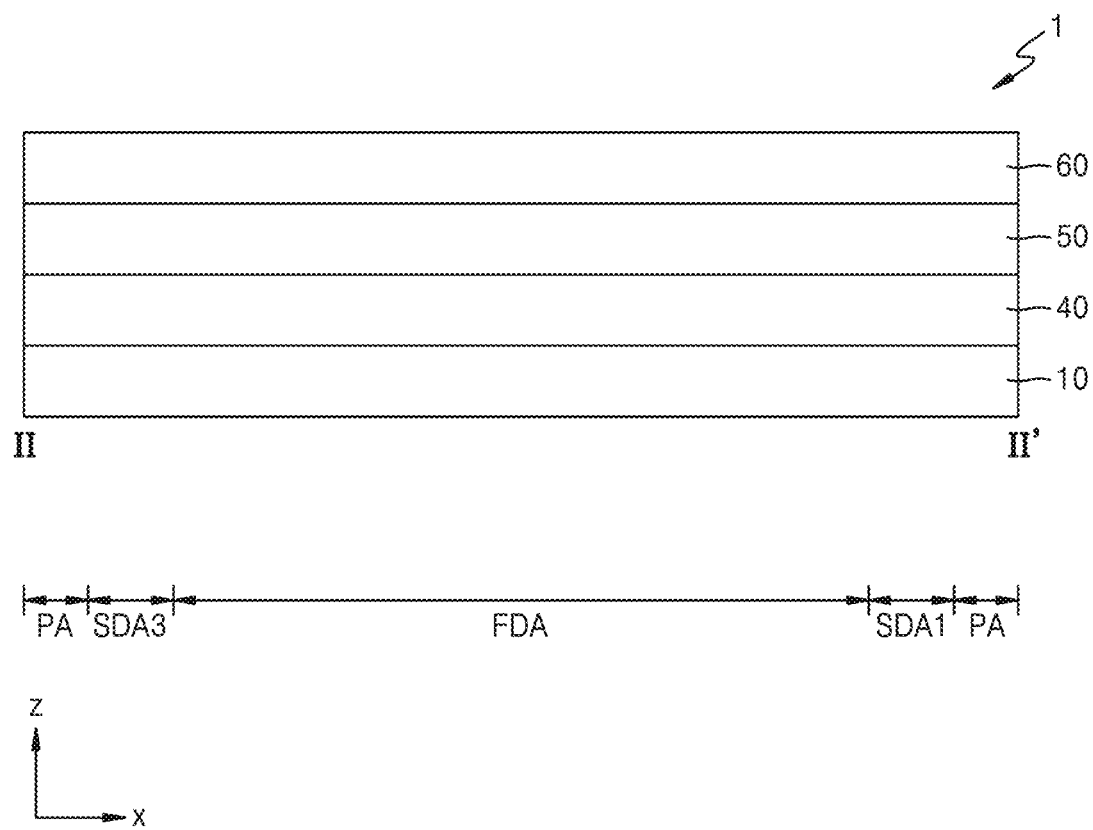
FIG. 2 is a schematic cross-sectional view of the display apparatus, according to an embodiment.

FIG. 2 is a schematic cross-sectional view of the display apparatus 1 according to an embodiment, and may correspond to a cross section of the display apparatus 1 taken along line II-II' of FIG. 1.

Referring to FIG. 2, an embodiment of the display apparatus 1 may include a display panel 10, an input sensing layer 40 on the display panel 10, and an optical functional layer 50, which may be covered by a window 60.

The display panel 10 may be configured to display an image. The display panel 10 may include a substrate SUB and a display unit DU including a light-emitting element EU above the substrate SUB and a pixel circuit PC connected thereto, as described below with reference to FIGS. 3 and 10A. The display panel 10 may include the pixels PX disposed in the display area DA. The pixels PX may be an emission area in which light emitted by the light-emitting element EU is provided.

The input sensing layer 40 obtains coordinate information in response to an external input, for example, a touch event. The input sensing layer 40 may include a sensing electrode (or a touch electrode) and trace lines connected to the sensing electrode. The input sensing layer 40 may be disposed on the display panel 10. The input sensing layer 40 may detect an external input by using a mutual capacitance method and/or a self-capacitance method.

The input sensing layer 40 may be provided or formed directly on the display panel 10, or may be separately formed and then coupled to the display panel 10 with an adhesive layer therebetween such as an optical clear adhesive. In one embodiment, for example, the input sensing layer 40 may be continuously formed after a process of forming the display panel 10. In such an embodiment, the input sensing layer 40 may be defined by a part of the display panel 10, and the adhesive layer may not be between the input sensing layer 40 and the display panel 10. FIG. 2 illustrates an embodiment where the input sensing layer 40 is between the display panel 10 and the optical functional layer 50. However, in an alternative embodiment, the input sensing layer 40 may be disposed on the optical functional layer 50.

The optical functional layer 50 may include an anti-reflective layer. The anti-reflective layer may reduce reflectance of light (external light) incident from an outside to the display panel 10 through the window 60. The anti-reflective layer may include a retarder and a polarizer. The window 60 may be disposed on the optical functional layer 50. The window 60 may protect the display panel 10, the input sensing layer 40, and the optical functional layer 50 from external impact. The window 60 may include a glass or a plastic, each having flexible properties, and may have transparent properties so that light output from the display panel 10 is transmitted therethrough. An adhesive layer (not shown) may be between the window 60 and the optical functional layer 50 or the input sensing layer 40, and may bond the window 60 and the optical functional layer 50 or the window 60 and the input sensing layer 40 together.

Figure 3:
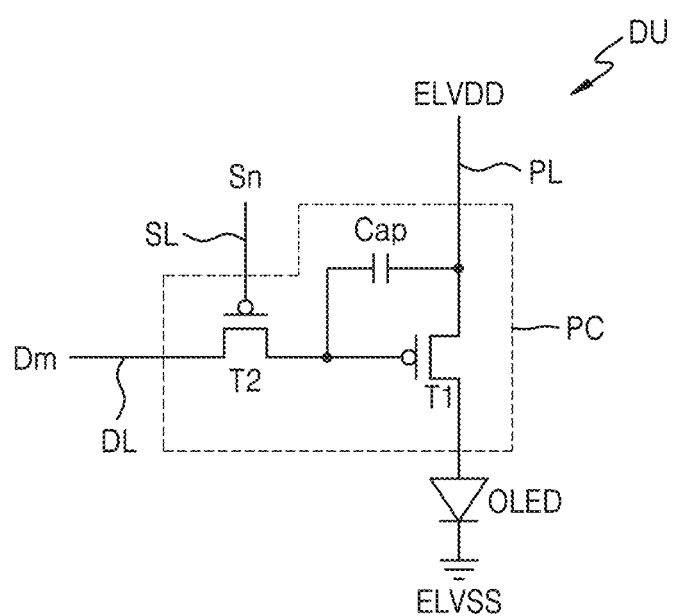
FIG. 3 is an equivalent circuit diagram of a pixel circuit of a display apparatus, according to an embodiment.

FIG. 3 is an equivalent circuit diagram of a pixel circuit of the display apparatus, according to an embodiment.

Referring to FIG. 3, an embodiment of the display apparatus 1 may include the display unit DU including a pixel circuit PC and a light-emitting element. The display apparatus 1 may include the pixel circuit PC including a plurality of thin-film transistors and a storage capacitor. In such an embodiment, the display apparatus 1 may include, as the light-emitting element, a light-emitting diode which receives a driving current through the pixel circuit PC and emits light. The light-emitting diode may be, for example, an organic light-emitting diode OLED. The light-emitting element may emit light through an emission area, and the emission area may define a pixel PX.

The pixel circuit PC may include the plurality of thin-film transistors and the storage capacitor. According to an embodiment, as illustrated in FIG. 3, the pixel circuit PC may include a first thin-film transistor T1, a second thin-film transistor T2, and a storage capacitor Cap. In one embodiment, for example, the first thin-film transistor T1 may be a driving thin-film transistor (also referred to as "TFT"), and the second thin-film transistor T2 may be a switching TFT. The second thin-film transistor T2 is connected to a scan line SL and a data line DL, and may transmit, to the first thin-film transistor T1, a data signal Dm input through the data line DL in response to a scan signal Sn input through the scan line SL.

The storage capacitor Cap is connected to the second thin-film transistor T2 and a driving voltage line PL, and may store a voltage corresponding to a difference between a first voltage ELVDD applied to the driving voltage line PL and a second voltage applied to the second thin-film transistor T2.

The first thin-film transistor T1 may be connected to the driving voltage line PL and the storage capacitor Cap, and may control a driving current flowing from the driving voltage line PL to the organic light-emitting diode OLED in response to a voltage value stored in the storage capacitor Cap. An opposite electrode of the organic light-emitting diode OLED is connected to a common voltage ELVSS. The organic light-emitting diode OLED may display an image by emitting light having a certain luminance corresponding to the driving current.

FIG. 3 illustrates an embodiment where the pixel circuit PC includes two thin-film transistors and one storage capacitor, but embodiments of the disclosure are not limited thereto. In one alternative embodiment, for example, the pixel circuit PC may include at least three thin-film transistors and/or at least two storage capacitors. In one embodiment, for example, the pixel circuit PC may include seven thin-film transistors and one storage capacitor. The numbers of the thin-film transistors and the number of the storage capacitors may be variously changed or modified based on a design of the pixel circuit PC. However, hereinafter, for convenience of description, embodiments in which the pixel circuit PC includes two thin-film transistors and a single storage capacitor will be described in detail.

Figure 4A:
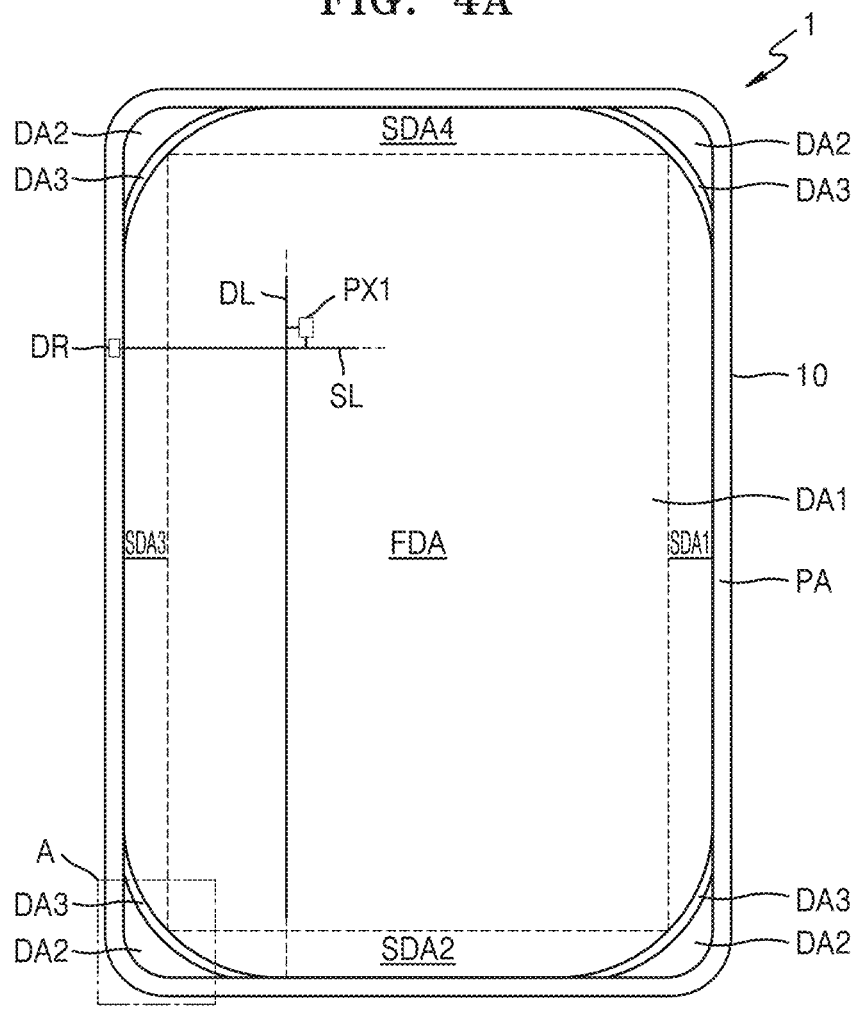
FIG. 4A is a schematic top plan view of a display apparatus, according to an embodiment.
Figure 4B:
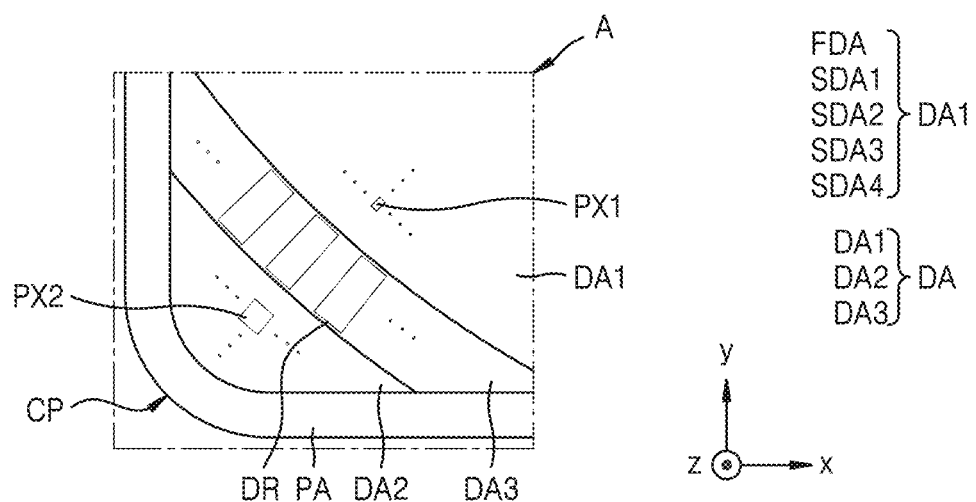
FIG. 4B is an enlarged view of the encircled portion A of FIG. 4A.

FIG. 4A is a schematic top plan view of the display apparatus 1, according to an embodiment. FIG. 4B is an enlarged view of the encircled portion A of FIG. 4A. An embodiment of the display apparatus 1 may include the substrate SUB, light-emitting elements EU, pixel circuits PC, drivers DR, and wires connected thereto, and FIGS. 4A and 4B are top plan views as seen from one side (e.g., a front side or a display side) of the display apparatus 1.

In an embodiment, as described above, the display apparatus 1 may include the display area DA and the peripheral area PA. The display area DA may include the first display area DA1 including the front display area FDA and the first to fourth side display areas SDA1, SDA2, SDA3, and SDA4, the second display area DA2, and the third display area DA3.

The display apparatus 1 may include a plurality of pixels PX disposed in the display area DA. In one embodiment, for example, the display apparatus 1 may include a plurality of first pixels PX1 disposed in the first display area DA1, a plurality of second pixels PX2 disposed in the second display area DA2, and a plurality of third pixels PX3 (shown in FIG. 8A) disposed in the third display area DA3.

The peripheral area PA may surround the display area DA. The peripheral area PA is a non-display area, which may be an area in which no light-emitting element such as an organic-light-emitting diode OLED for emitting light is provided, or an area in which the light-emitting element is not electrically connected to the pixel circuit PC even if the light-emitting element is disposed therein. A driver DR configured to provide each of the plurality of pixels PX with an electrical signal through a wire may be disposed in the peripheral area PA. In one embodiment, for example, the driver DR may be a scan driver configured to provide each pixel PX with a scan signal through the scan line SL connected thereto.

In an embodiment, a data driver (not shown) configured to provide each pixel PX with a data signal through the data line DL and a power wire (not shown) for providing each pixel PX with a power voltage may be disposed in the peripheral area PA. The data driver may be disposed adjacent to one side surface of the display apparatus 1, or may be disposed above a flexible printed circuit board ("FPCB"), which is electrically connected to a pad disposed at one side of the display apparatus 1.

The encircled portion A in FIG. 4A is an area adjacent to the corner portion CP of the display apparatus 1, and FIG. 4B illustrates an enlarged top plan view of the encircled portion A. Referring to FIG. 4B, the driver DR may also be disposed in the third display area DA3 as well as in the peripheral area PA. In such an embodiment, the driver DR disposed in the third display area DA3 may provide an electrical signal to the first pixels PX1 disposed in the first display area DA1 and the second pixels PX2 disposed in the second display area DA2, such that the driver DR may not be disposed in the peripheral area PA partially surrounding the second display area DA2. In an alternative embodiment, some of the drivers DR may be disposed in the peripheral area PA.

According to an embodiment, the pixels PX, for example, the second pixels PX2, may also be disposed in the second display area DA2 disposed at the corner portion CP of the display apparatus 1. Such an embodiment will be described later in greater detail with reference to FIGS. 5A, 5B, 6A, and 6B. In an embodiment, the third pixels PX3 may also be disposed in the third display area DA3 in which the driver DR is arranged, to thereby display an image. Such an embodiment will be described later in greater detail with reference to FIGS. 8A, 8B, 9A, 9B, and 9C.

Figure 5A:
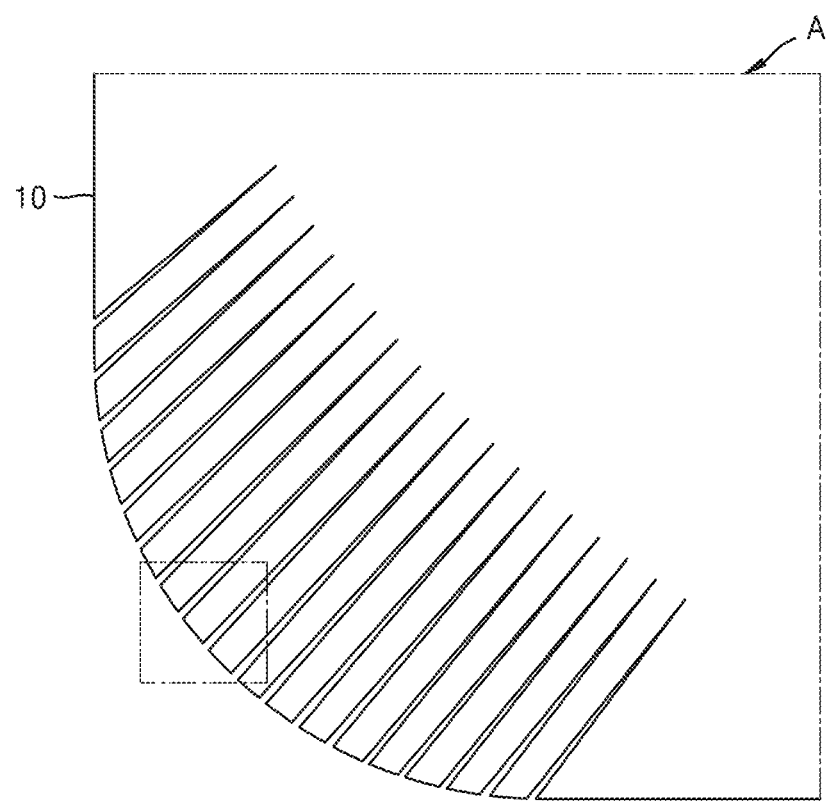
FIGS. 5A and 5B are each a schematic top plan view of an enlarged portion of a display apparatus, according to an embodiment.
Figure 5B:
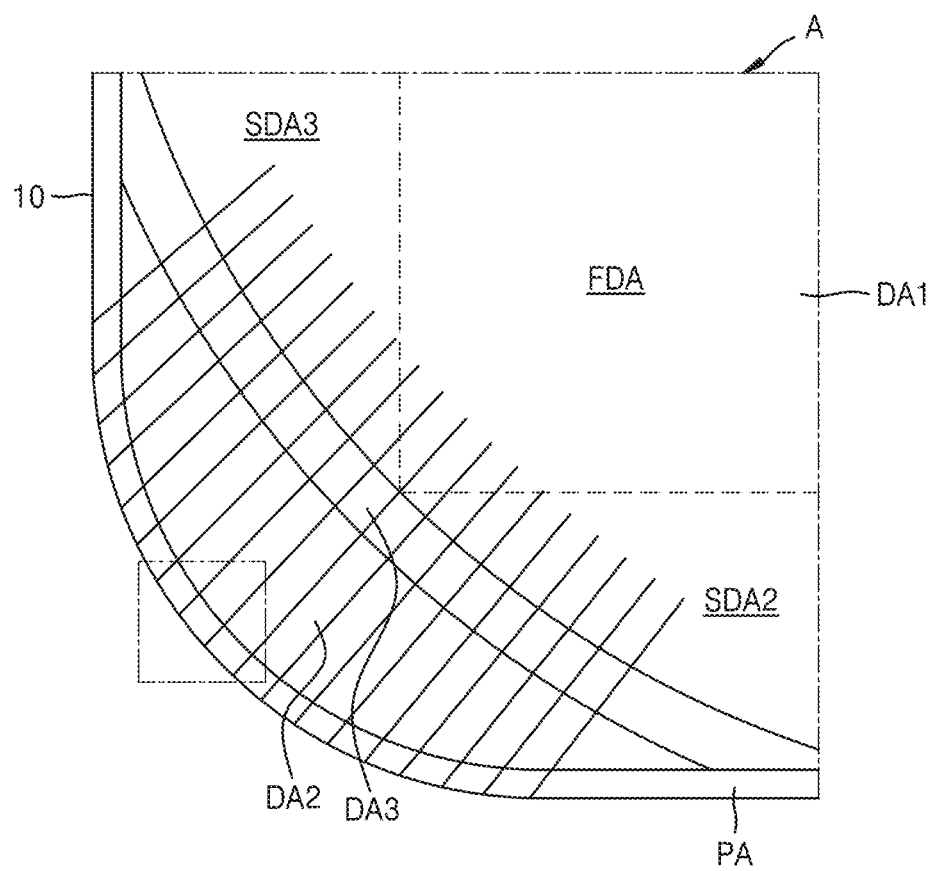
Figure 5C:
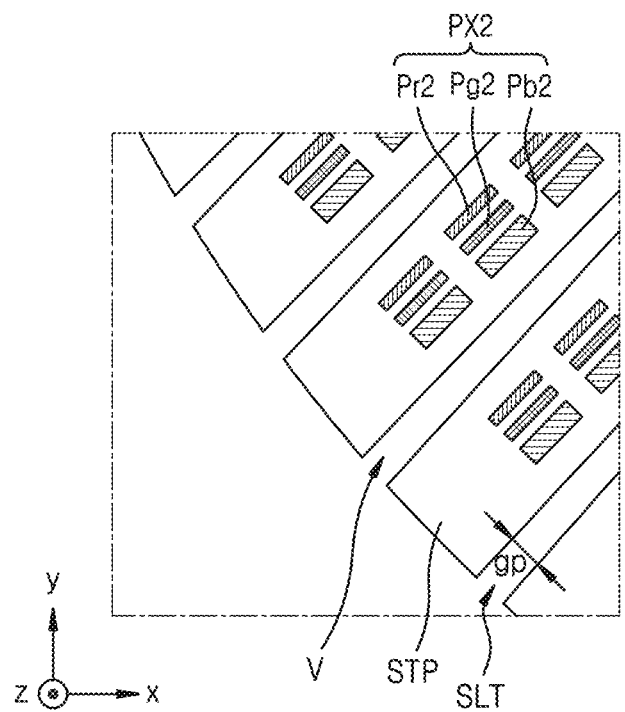
FIGS. 5C and 5D are enlarged views of the encircled portions of FIGS. 5A and 5B, respectively.
Figure 5D:
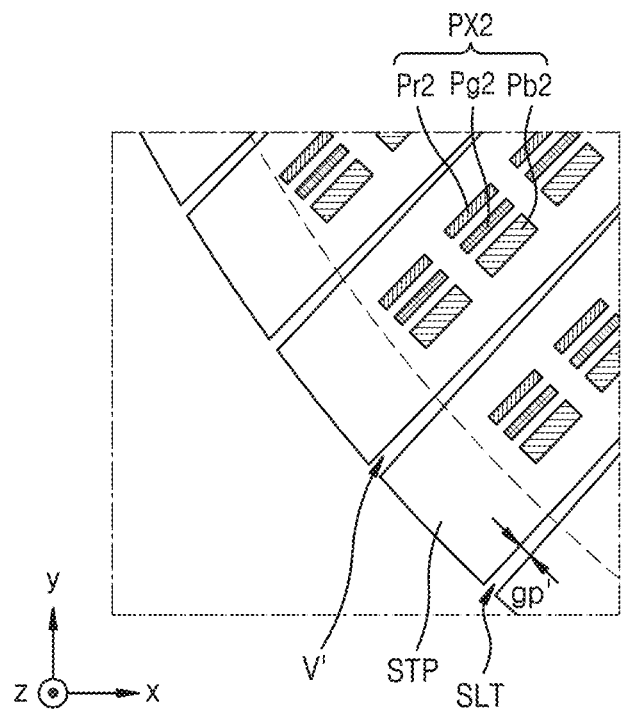

FIGS. 5A and 5B are each a schematic top plan view of an enlarged portion of a display apparatus, according to an embodiment. FIGS. 5C and 5D are enlarged views of the encircled portions of FIGS. 5A and 5B, respectively. FIGS. 5A and 5B may correspond to the area A of FIG. 4A or FIG. 4B. FIG. 5A is a state of a display panel before an external force is applied thereto, and FIG. 5B is a state of the display panel that is deformed due to the applied external force.

Referring to FIGS. 5A and 5C, an embodiment of the display panel 10 may include a substrate with slits SLT located at a corner thereof and cut in a direction toward the corner of the substrate from an inner side of the substrate and strip portions STP between neighboring slits SLT. The corner of the substrate may be an area corresponding to at least the second display area DA2.

The substrate may include various materials such as a glass, a metal, or an organic material. In an embodiment, the substrate may include a flexible material. In one embodiment, for example, the substrate may include a ultra-thin flexible glass (for example, having a thickness of several tens to several hundreds of micrometer) or a polymer resin. In an embodiment where the substrate includes the polymer resin, the substrate may include polyimide ("PI"). Alternatively, the substrate may include, for example, polyethersulfone ("PES"), polyarylate, polyetherimide ("PEI"), polyethylene napthalate ("PEN"), polyethyleneterepthalate ("PET"), polyphenylene sulfide ("PPS"), polycarbonate ("PC"), cellulose triacetate ("TAC"), and/or cellulose acetate propionate ("CAP").

The slits SLT may be located at a corner of the substrate. A portion adjacent to the corner of the substrate is cut in a direction toward the corner of the substrate from an inner side of the substrate, such that the slits SLT may be formed. The slits SLT may be defined by a cut portion extending in a direction in which the substrate is cut. The slits SLT may be disposed in parallel to each other or may be disposed in a radial shape.

The strip portions STP may be between the slits SLT adjacent to each other. A strip portion STP may be defined by a portion between two adjacent slits SLT in the substrate. One end portion of the strip portion STP may be a portion of the corner of the substrate, and the other portion thereof may be connected to a body of the substrate. Here, the body of the substrate may indicate a portion of the substrate in which the slits SLT are not formed. In other words, the strip portion STP may be a portion surrounded by the two adjacent slits SLT, the portion of the corner of the substrate, and the body of the substrate. The strip portions STP may extend substantially in parallel to neighboring slits SLT.

At least a portion of the strip portions STP may be spaced apart from each other by the slits SLT. In one embodiment, for example, neighboring strip portions STP may be spaced apart from each other with a certain gap gp therebetween in a direction perpendicular to an extension direction of the strip portions STP, such that a separation area V may be formed. The separation area V may be defined through an upper surface and lower surface of the display panel 10, reduce a weight of the display apparatus 1, and improve the flexibility of the display apparatus 1. The gap gp may increase as moving in a direction toward a corner of the substrate from an inner side of the substrate.

The pixels PX, for example, the second pixels PX2, may be disposed on the strip portions STP. In an embodiment, as described above, light in a visible light band may be emitted by a light-emitting element of a display unit, and the light emitted by the light-emitting element may be provided through an emission area having a certain area on a plane. The emission area may define a pixel PX, and a second pixel PX2 may be defined by an emission area of a second display unit DU2 (in FIG. 9B).

In an embodiment, each of the second pixels PX2 may include a red second sub pixel Pr2, a green second sub pixel Pg2, and a blue second sub pixel Pb2. In such an embodiment, the red second sub pixel Pr2, the green second sub pixel Pg2, and the blue second sub pixel Pb2 may be disposed on each strip portion STP.

The red second sub pixel Pr2, the green second sub pixel Pg2, and the blue second sub pixel Pb2 may be spaced apart from one another in one direction. The red second sub pixel Pr2, the green second sub pixel Pg2, and the blue second sub pixel Pb2 may be spaced apart from one another in a first direction DR1 (shown in FIG. 6B).

Referring to FIGS. 5B and 5D, when an external force (for example, a force such as bending or compressing) is applied to the display panel 10, a shape of the separation area V changes. Thus, a position of the strip portions STP may change, and a distance between pixels may change. In one embodiment, for example, when a force of bending edges of the display panel 10 and a corner therebetween is applied, as a gap gp' decreases, an area of a separation area V' may become narrow, and neighboring strip portions STP may contact each other. Accordingly, the second pixels PX2 may become closer to each other.

Even when an external force is applied to the display panel 10, elements disposed above the strip portion STP, for example, a pixel circuit and a light-emitting element, may not change in shape, and the pixel PX may be stably maintained. Thus, the pixel PX may be securely disposed on a curved surface located at the corner portion CP of the display apparatus 1. In such an embodiment, the second pixel PX2 may be allowed to be disposed stably in the second display area DA2. Accordingly, the display area DA may be effectively expanded.

FIGS. 5A and 5B illustrate an embodiment where sub pixels of the second pixel PX2 are disposed as a stripe type, but embodiments are not limited thereto, and alternatively, the sub pixels may be disposed to be one of various types, for example, an s-stripe type or a pentile type.

Figure 6A:
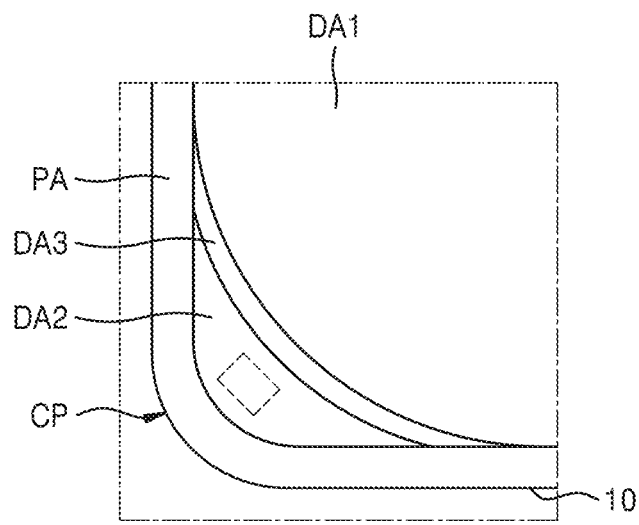
FIG. 6A is a schematic top plan view of an enlarged portion of a display apparatus, according to an alternative embodiment.
Figure 6B:
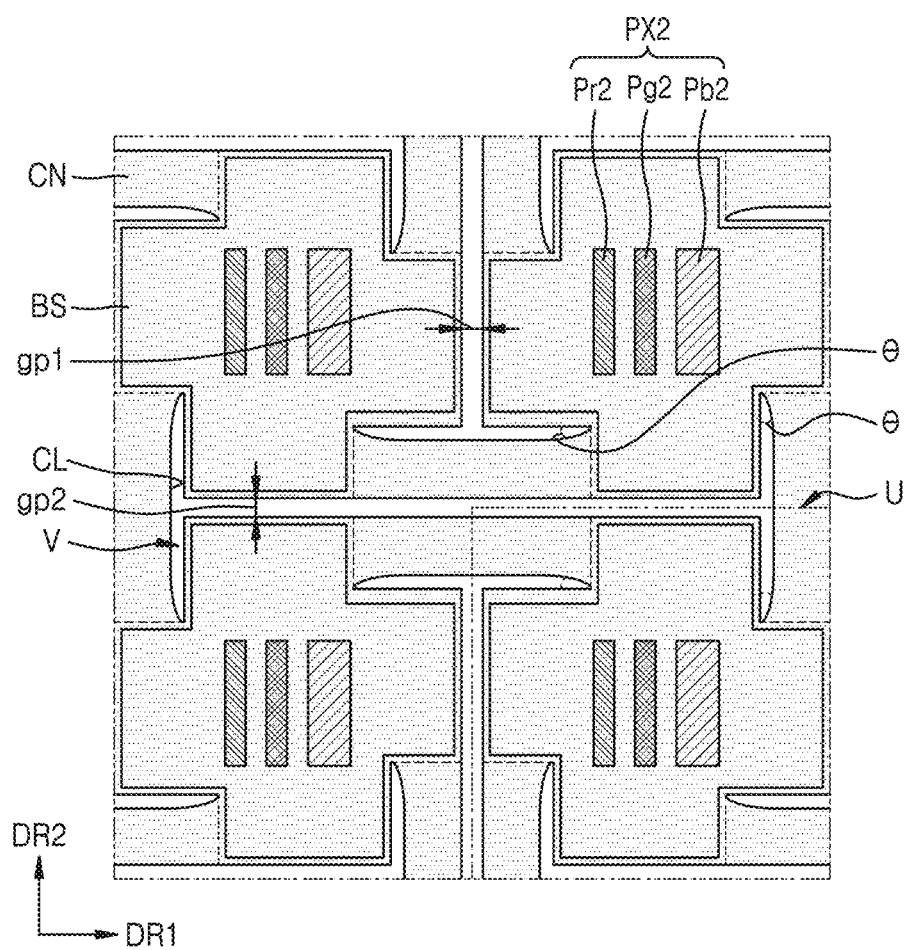
FIGS. 6B and 6C are each an enlarged view of the encircled portion of FIG. 6A, according to an embodiment.
Figure 6C:
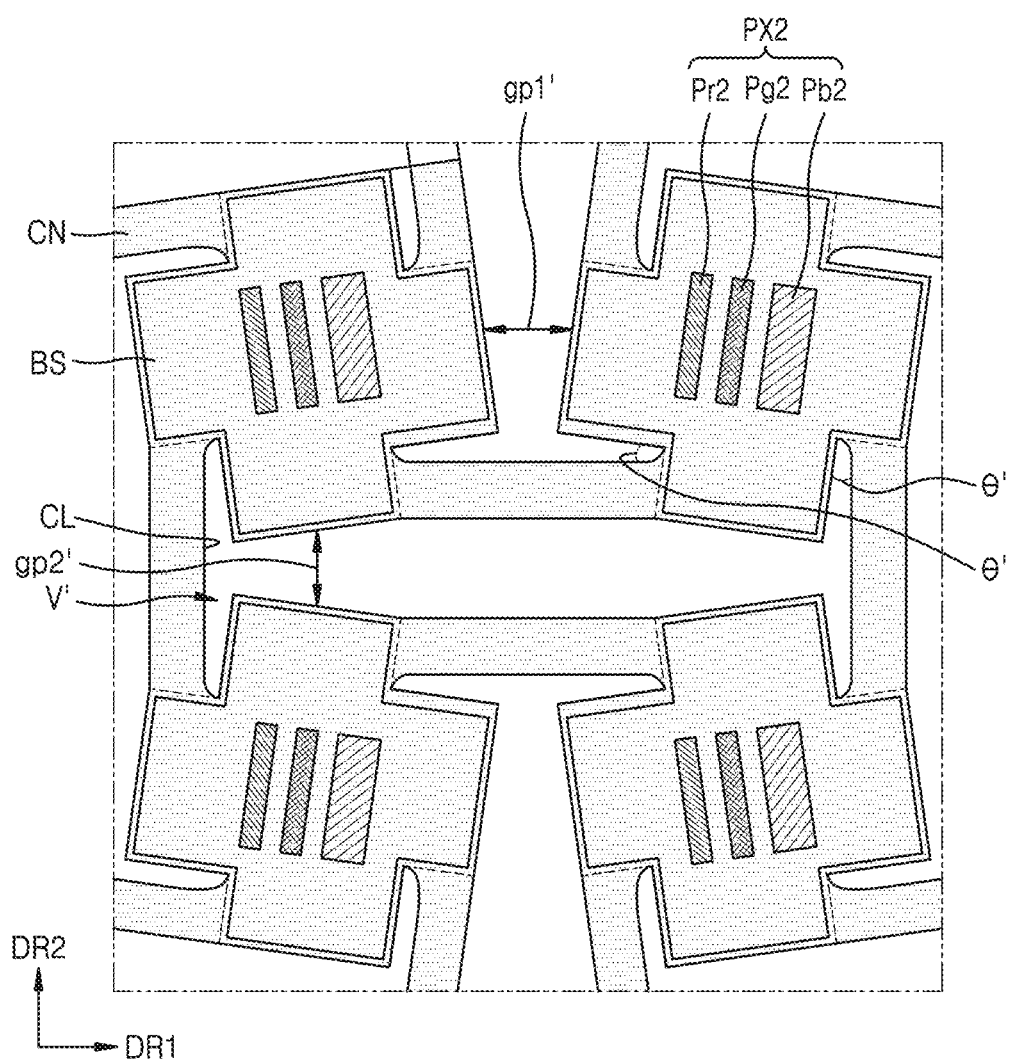

FIG. 6A is a schematic top plan view of an enlarged portion of a display apparatus, according to another embodiment. FIGS. 6B and 6C are each an enlarged view of the encircled portion of FIG. 6A, according to an embodiment. FIGS. 6A to 6C illustrate enlarged view of the second display area located at a corner portion of a display apparatus.

Referring to FIGS. 6A to 6C, an embodiment of the display apparatus 1 may include the substrate SUB and the pixels PX.

A portion in the second display area DA2 of the display apparatus 1 may include a plurality of bases BS that are spaced apart from each other, a plurality of connectors CN connecting the plurality of bases BS to each other, and a plurality of separation areas V, which are defined between the plurality of connectors CN and through the substrate SUB.

The plurality of bases BS may be spaced apart from each other. In one embodiment, for example, the plurality of bases BS may form a planar grid pattern that is repeatedly arranged in the first direction DR1 and a second direction DR2 that is different from the first direction DR1. In an embodiment, as shown in FIGS. 6B and 6C the first direction DR1 and the second direction DR2 may be directions orthogonal to each other. In an alternative embodiment, the first direction DR1 and the second direction DR2 may form an obtuse angle or an acute angle. Each of the first direction DR1 and the second direction DR2 may be a direction along an edge of the first display area DA1, for example, an x-axis direction and y-axis direction described with respect to FIG. 4B. Alternatively, each of the first direction DR1 and the second direction DR2 may be a direction that forms a constant angle with the edge of the first display area DA1, and for example, may form about 45° with the edge.

The second pixels PX2 may be disposed on the plurality of bases BS. In an embodiment, as described above, light in a visible light band may be emitted by a light-emitting element of the display unit DU (in FIG. 10A), and the light emitted by the light-emitting element may be provided through an emission area having a certain area on a plane. The emission area may define a pixel PX, and a second pixel PX2 may be defined by an emission area of the second display unit DU2 (in FIG. 9B).

In an embodiment, each of the second pixels PX2 may include the red second sub pixel Pr2, the green second sub pixel Pg2, and the blue second sub pixel Pb2. In such an embodiment, the red second sub pixel Pr2, the green second sub pixel Pg2, and the blue second sub pixel Pb2 may be disposed on each of the plurality of bases BS.

The red second sub pixel Pr2, the green second sub pixel Pg2, and the blue second sub pixel Pb2 may be spaced apart from one another in one direction. The red second sub pixel Pr2, the green second sub pixel Pg2, and the blue second sub pixel Pb2 may be spaced apart from one another in the first direction DR1, and distances (for example, a shortest distance in the first direction DR1) between neighboring emission areas may be substantially the same as each other.

FIGS. 6A to 6C illustrate an embodiment where sub pixels of the second pixel PX2 are disposed as a stripe type, but embodiments are not limited thereto, and alternatively, the sub pixels may be disposed to be one of various types, for example, an s-stripe type or a pentile type.

The plurality of connectors CN may connect neighboring bases BS to each other. In one embodiment, for example, four connectors CN may be connected to each of the bases BS. Four connectors CN connected to one base BS may extend in different directions from each other, and each of the four connectors CN may be connected to another base BS adjacent to the one base BS. In one embodiment, for example, one base BS may be connected, via four connectors CN, to four bases BS surrounding the one base BS. Wires for applying an electrical signal or the like to the second display unit DU2 may be disposed above the connectors CN.

The plurality of bases BS and the plurality of connectors CN may include a same material as each other and may be continuously connected to each other. In such an embodiment, the plurality of bases BS may be integrally formed with the plurality of connectors CN as a single unitary unit.

Hereinafter, for convenience of description, one base BS and connectors CN connected thereto will be collectively referred to as a basic unit U, and a structure of a portion of the display apparatus 1, which corresponds to the second display area DA2, will be described in greater detail with reference to the basic unit U. The basic unit U may be repeatedly disposed in the first direction DR1 and the second direction DR2, and a portion of a display panel DP in the second display area DA2 is formed or defined by connecting repeatedly disposed basic units U to each other. Two adjacent basic units U may be symmetrical to each other. In one embodiment, for example, as shown in FIG. 6B, two basic units U that are horizontally adjacent to each other may be horizontally symmetrical with respect to an axis of symmetry which is located therebetween and is parallel with the second direction DR2. In such an embodiment, as shown in FIG. 6B, two basic units U that are vertically adjacent to each other may be vertically symmetrical with respect to an axis of symmetry which is located therebetween and is parallel with the first direction DR1.

Basic units U adjacent to each other among the basic units U, for example, four basic units U illustrated in FIG. 6B, form a folium CL therebetween, and the folium CL may define a separation area V, which is an empty space. In one embodiment, for example, the separation area V may be defined as the folium CL formed by edges of the plurality of bases BS and the plurality of connectors CN.

Each separation area V may be defined or formed through an upper surface and a lower surface of the display panel 10. Each separation area V may provide a separation area between the plurality of bases BS, reduce a weight of the display apparatus 1, and improve the flexibility of the display apparatus 1. When an external force (for example, a force of twisting, bending, pulling, or compressing) is applied to the display apparatus 1, shapes of the separation areas V may change. Thus, stress generation during deformation of the display apparatus 1 may be effectively reduced, thereby preventing the display apparatus 1 from abnormal deformation, and improving durability.

In an embodiment, the separation area V may be formed by removing an area of an element of the display apparatus 1 by etching or the like, or may be formed to include the separation area V during manufacture of the display apparatus 1. In such an embodiment, a process in which the separation area V is formed in an element of the display apparatus 1 may be selected from various known methods, and a method of manufacturing the separation area V is not limited to a particular process.

An angle θ between an edge of the base BS included in one basic unit U and an edge of each of the connectors CN included in the one basic unit U may be an acute angle, and when an external force, for example, a force of pulling the display apparatus 1, is applied, an angle θ' (θ'>θ) between an edge of the base BS and an edge of each connector CN may increase, an area or shape of the separation area V' may change, and a position of the base BS may also change, as described with respect to FIG. 6C. FIG. 6C is a top plan view of the display apparatus 1, which is stretched in the first direction DR1 and the second direction DR2, and when the force is applied, each of the bases BS may rotate at a certain angle according to a change in the angle θ and an increase in the area of the separation area V' and/or shape deformation of the separation area V'. Due to rotation of each of the bases BS, a gap, for example, a first gap gp1 and a second gap gp2, between the bases BS may vary (e.g., be changed to increased gaps gp1' and gp2' shown in FIG. 6C) according to a position.

When a force of pulling the display apparatus 1 is applied, stress may concentrate on a connector CN connected to an edge of the base BS, and the folium CL, which defines the separation area V to prevent the display apparatus 1 from being damaged, may include a curved line.

In an embodiment, when a force of compressing the display apparatus 1 is applied, the angle θ between an edge of the base BS and an edge of each connector CN may decrease, an area or shape of the separation area V may change, and a position of the base BS may also change.

In such an embodiment, stretching and contracting characteristics may be imparted to the display apparatus 1. According to a force applied to a portion, which corresponds to the second display area DA2, of the display apparatus 1, a distance between the second pixels PX2 above the bases BS may change.

Because the connector CN may have a smaller width than the base BS, a shape change for increasing the angle when an external force is applied to the display apparatus 1 may appear mainly in the connector CN, and a shape of the base BS may not substantially change even when the display panel DP is being stretched or contracted. Therefore, the second pixel PX2 disposed on the base BS may be stably maintained even when the display panel DP is being stretched or contracted. Thus, the pixel PX may also be disposed above a curved surface located at the corner portion CP of the display apparatus 1. In such an embodiment, the second pixel PX2 may be allowed to be disposed stably in the second display area DA2. Accordingly, the display area DA may be effectively expanded.

Figure 7A:
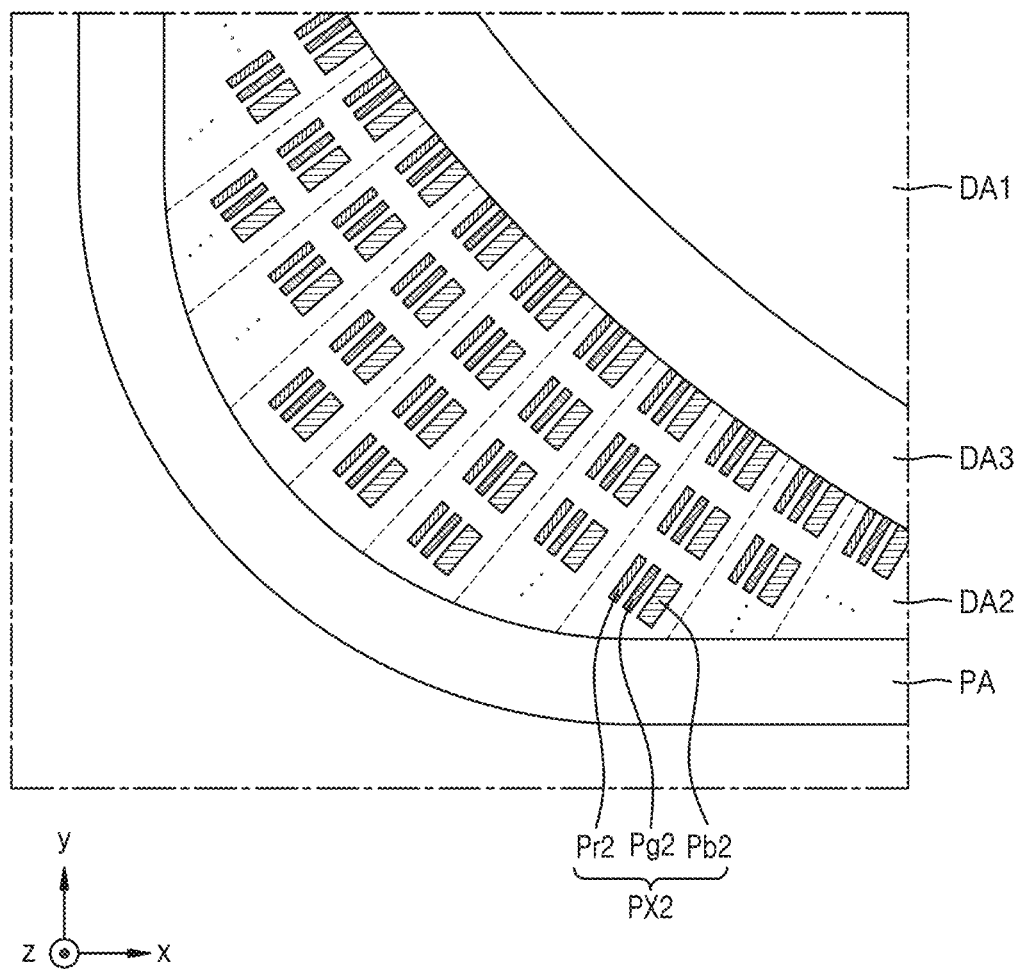
FIGS. 7A and 7B are each a schematic top plan view of an enlarged portion of a display apparatus, according to embodiments.
Figure 7B:
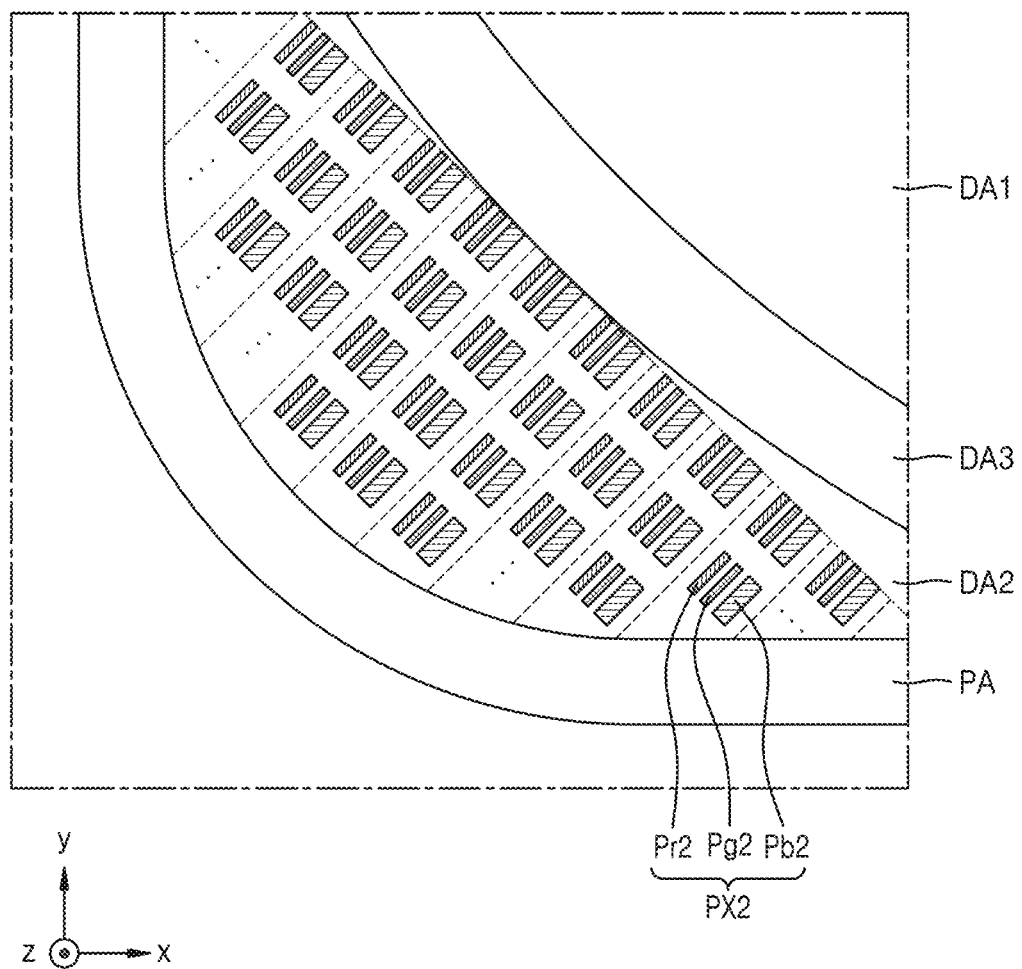

FIGS. 7A and 7B are each a schematic top plan view of an enlarged portion of a display apparatus, according to embodiments. FIGS. 7A and 7B illustrate an arrangement of second pixels on a plane.

Referring to FIGS. 7A and 7B, the second display area DA2 may be entirely or at least partially surrounded by the third display area DA3 and the peripheral area PA on a plane. A boundary between the second display area DA2 and the third display area DA3 may include a curved line or a straight line on a plane. Hereinafter, for convenience of description, embodiments, in which the second display area DA2 is entirely surrounded by the third display area DA3 and the peripheral area PA, and a boundary between the second display area DA2 and the third display area DA3 includes a curved line, will be described.

In an embodiment, the second pixels PX2 disposed in the second display area DA2 may be disposed along the curved line and may be disposed in a direction perpendicular to the curved line, as shown in FIG. 7A. Accordingly, the second pixels PX2 may be disposed in a radial shape.

In an alternative embodiment, the second pixels PX2 may be disposed in a direction of a tangent line to the curved line and may be disposed in a direction perpendicular to the tangent line, as shown in FIG. 7B. In such an embodiment, distances between the second pixels PX2 adjacent to each other may be the same as each other. The arrangements of the second pixels PX2 are merely exemplary, and embodiments are not limited thereto.

FIGS. 7A and 7B illustrate embodiments where sub pixels of the second pixel PX2 are disposed as a stripe type, but the sub pixels may be disposed to be one of various types, for example, an s-stripe type or a pentile type, as described above.

Figure 8A:
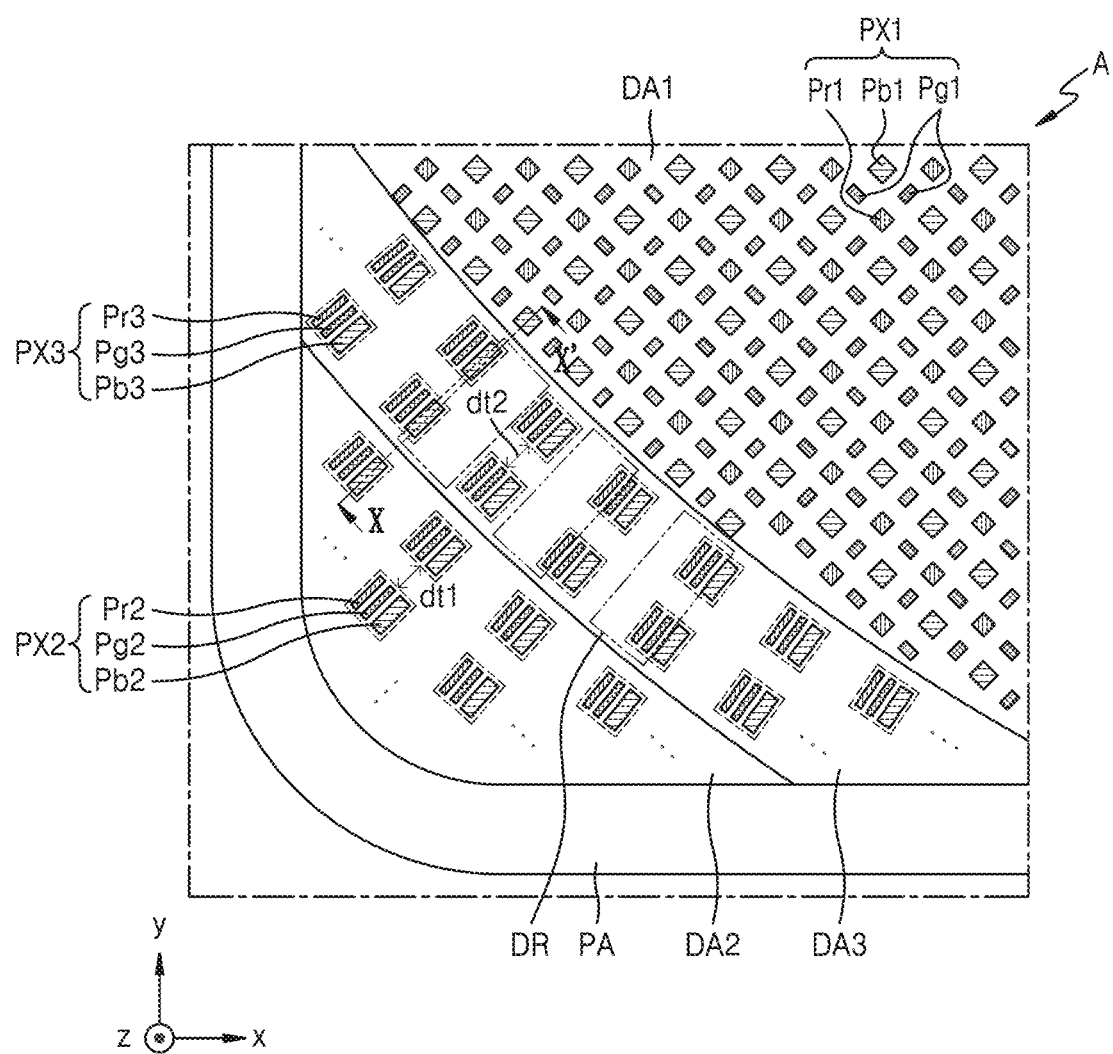
FIGS. 8A and 8B are each a schematic top plan view of an enlarged portion of a display apparatus, according to embodiments.
Figure 8B:
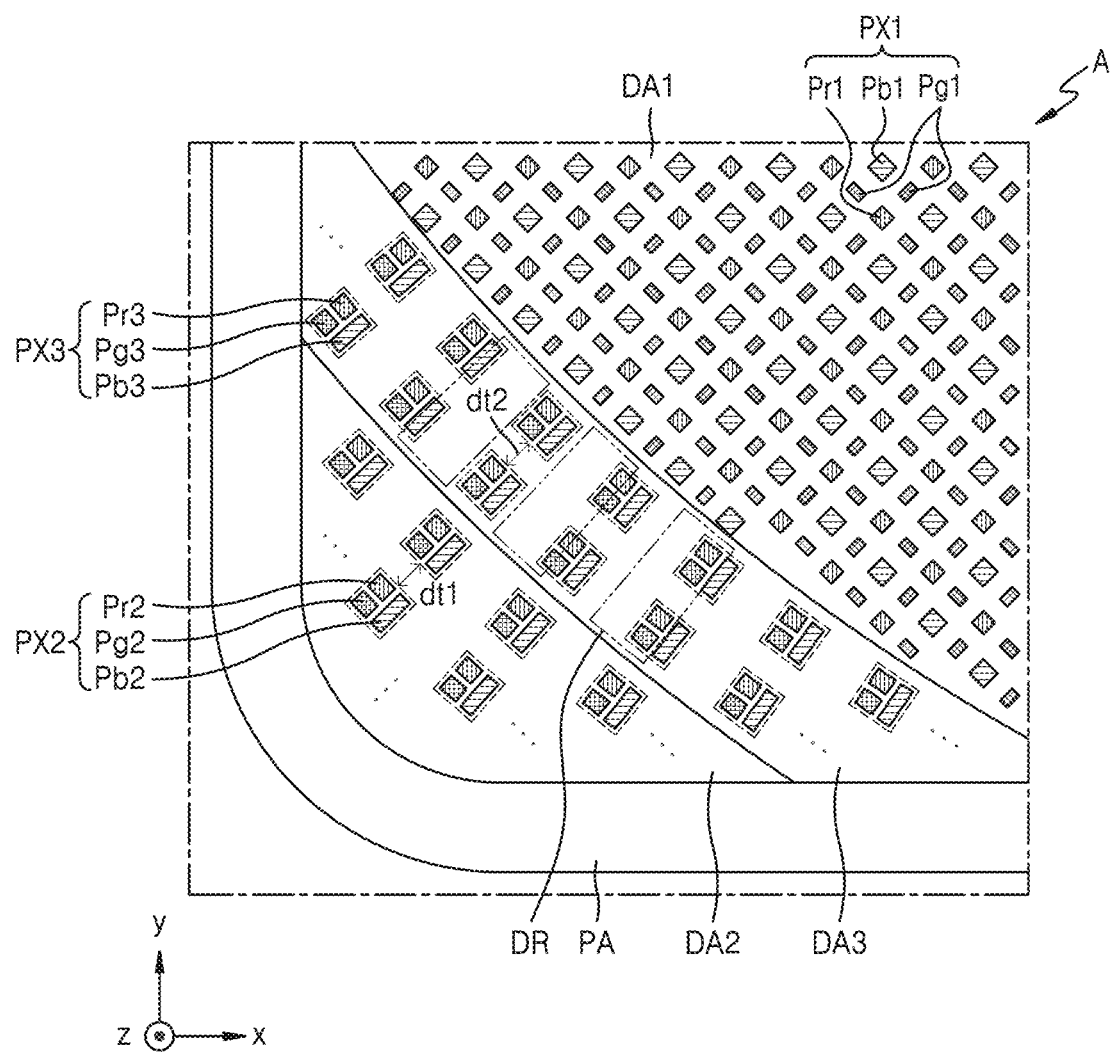

FIGS. 8A and 8B are each a schematic top plan view of an enlarged portion of a display apparatus, according to an embodiment. FIGS. 8A and 8B may correspond to the area A of the display apparatus of FIG. 4A.

Referring to FIGS. 8A and 8B, in an embodiment, the first pixels PX1 may be in the first display area DA1. Each of the first pixels PX1 may include a red first sub pixel Pr1, a green first sub pixel Pg1, and a blue first sub pixel Pb1. In an embodiment, a first pixel PX1 includes sub pixels disposed in a pentile type. In such an embodiment, one red first sub pixel Pr1, two green first sub pixels Pg1, and one blue first sub pixel Pb1 may constitute the first pixel PX1.

The second pixels PX2 and the third pixels PX3 may be in the second display area DA2 and the third display area DA3, respectively. Each of the second pixels PX2 may include the red second sub pixel Pr2, the green second sub pixel Pg2, and the blue second sub pixel Pb2, and each of the third pixels PX3 may include a red third sub pixel Pr3, a green third sub pixel Pg3, and a blue third sub pixel Pb3. In an embodiment, the second pixel PX2 and the third pixel PX3 may include sub pixels disposed in a stripe type. In such an embodiment, one red second sub pixel Pr2, one green second sub pixel Pg2, and one blue second sub pixel Pb2 may constitute one second pixel PX2, and one red third sub pixel Pr3, one green third sub pixel Pg3, and one blue third sub pixel Pb3 may constitute one third pixel PX3.

The driver DR may be disposed in the third display area DA3 as described above with reference to FIG. 3. An area in which the driver DR is disposed is indicated by a dot-dot-dash line in FIGS. 8A and 8B. The third pixels PX3 may include at least a portion overlapping the driver DR. Accordingly, areas in which the driver DR is disposed may function as a display area.

First distances dt1 between neighboring second pixels PX2 may be the same as each other, and second distances dt2 between neighboring third pixels PX3 may be the same as each other. A first distance dt1 from among the first distances dt1 and a second distance dt2 from among the second distances dt2 may be shortest distances in a direction perpendicular to a boundary between the second display area DA2 and the third display area DA3. In an embodiment, the first distance dt1 may be the same as the second distance dt2. In an alternative embodiment, the first distance dt1 and the second distance dt2 may be different from each other.

In an embodiment, the second pixels PX2 and the third pixels PX3 may be disposed to be of a same type. In one embodiment, for example, both the second pixels PX2 and the third pixels PX3 may be disposed in a stripe type as described with respect to FIG. 8A, may be disposed as an s-stripe type in described with respect to FIG. 8B, or may be disposed in a pentile type (not shown). In an alternative embodiment, the second pixels PX2 and the third pixels PX3 may be disposed to be of different types.

In an embodiment, areas of the second pixel PX2 may be the same as those of the third pixel PX3 on a plane. In such an embodiment, an area of an emission area of a second light-emitting element EU2 (in FIG. 10A) included in the second display unit DU2 (in FIG. 10A) may be to the same as an area of an emission area of a third light-emitting element EU3 (in FIG. 10A) included in a third display unit DU3 (in FIG. 10A). In an alternative embodiment, areas of the second pixel PX2 and the third pixel PX3 on a plane may be different from each other.

The second pixels PX2 and the third pixels PX3 have the same distance and area and are disposed to be of a same type, and thus, an image quality difference that may occur between the second display area DA2 and the third display area DA3 may be eliminated or minimized.

In an embodiment, areas of the second pixel PX2 and the third pixel PX3 on a plane may be greater than an area of the first pixel PX1. In such an embodiment, the areas of the emission areas of the second and third light-emitting elements EU2 and EU3 may be greater than an area of an emission area of a first light-emitting element EU1 (in FIG. 10A) included in a first display unit DU1 (in FIG. 10A). The pixel densities or the number of the pixels (i.e., resolution) disposed in unit area of the second display area DA2 and the third display area DA3 may be less than that of the first display area DA1. In such an embodiment, a space in which the second pixel PX2 and the third pixel PX3 may be disposed may be further secured, such that areas of the second pixel PX2 and the third pixel PX3 on a plane may be largely formed. Thus, the lifespan of the second and third pixels PX2 and PX3 may increase.

Figure 9A:
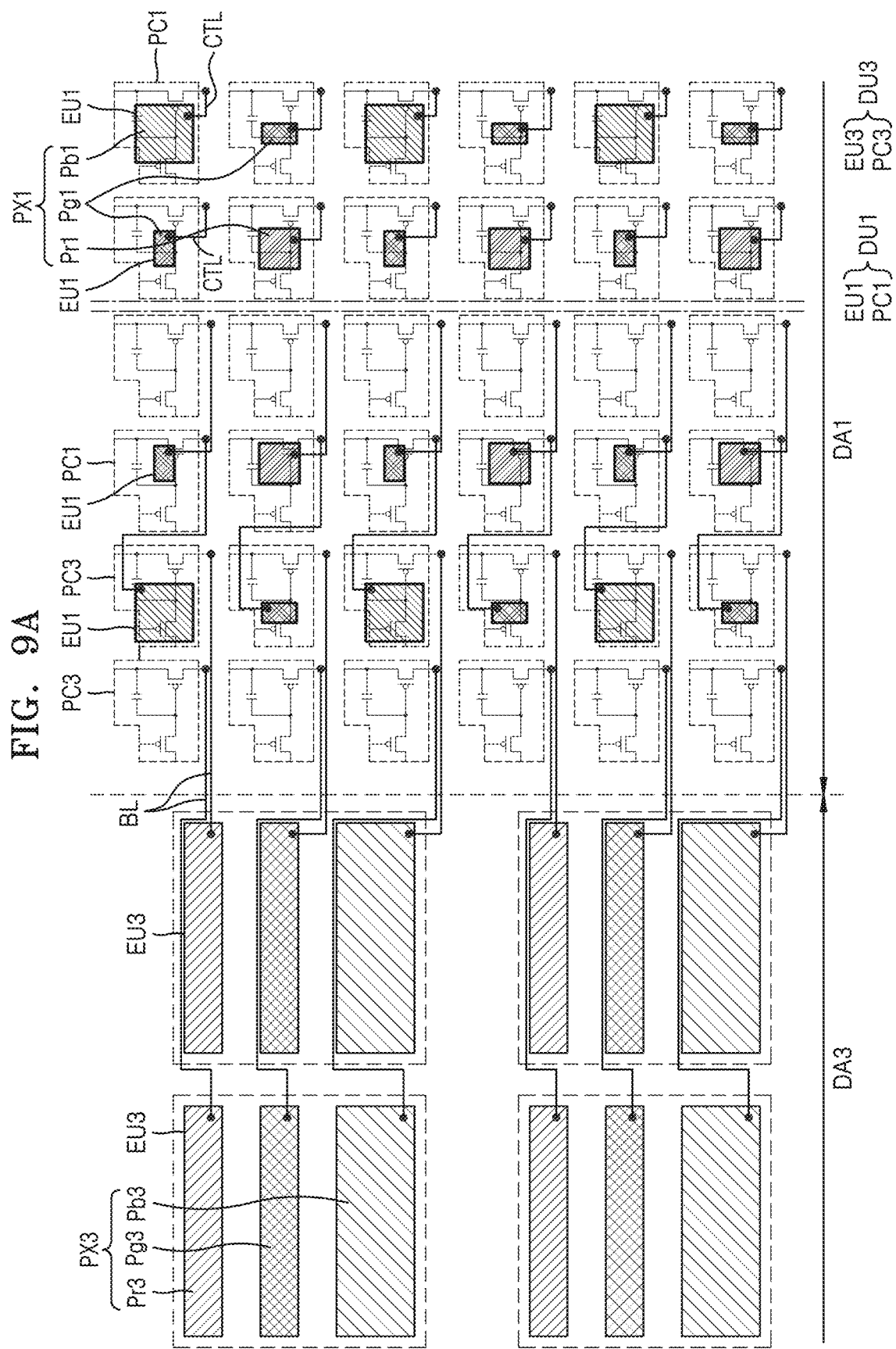
Figure 9C:
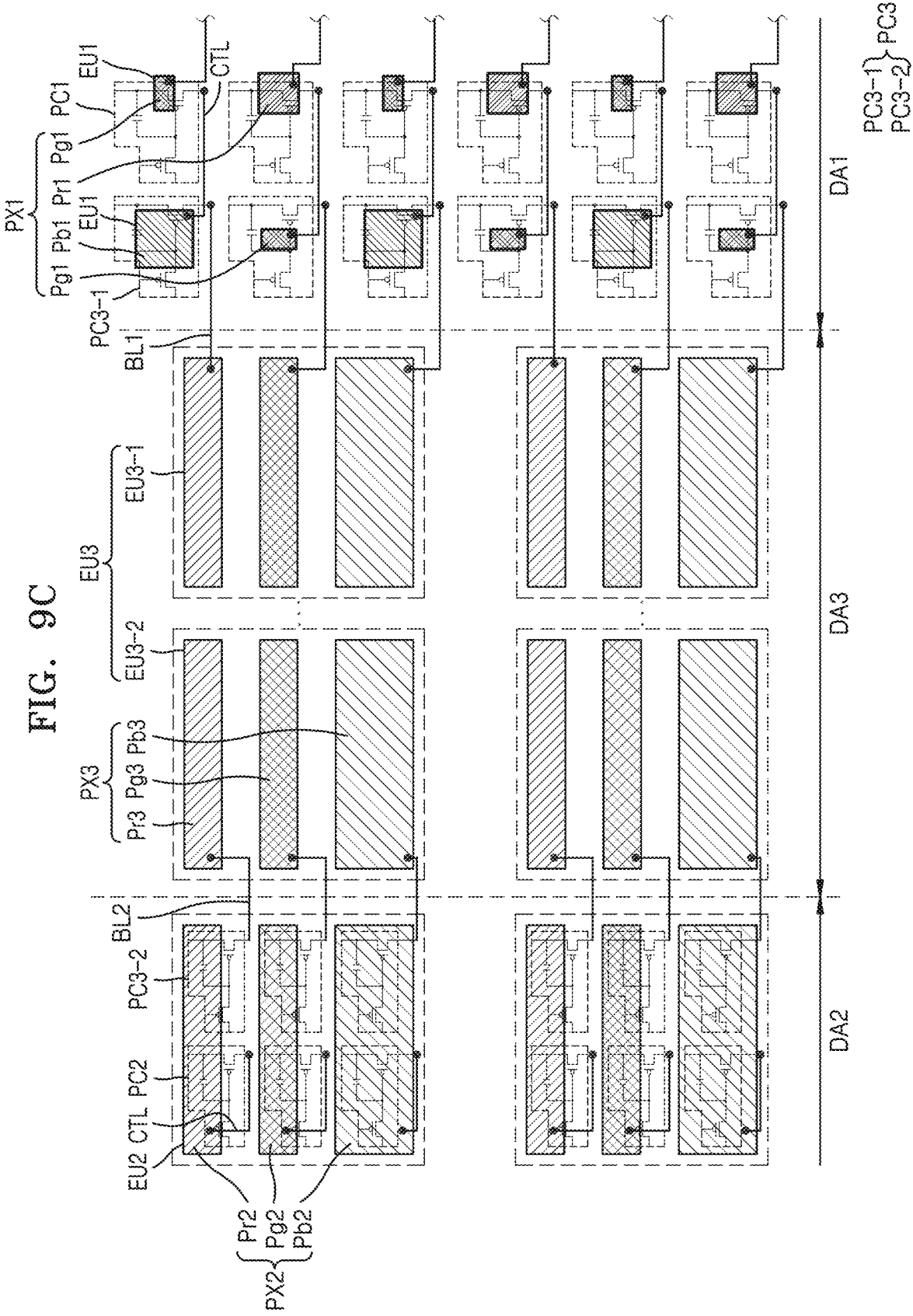

FIGS. 9A to 9C are each a schematic top plan view of arrangements of a pixel circuit and a light-emitting element of a display apparatus, according to embodiments.

First, FIG. 9A illustrates an embodiment of arrangements of a pixel circuit and a light-emitting element with respect to an area adjacent to a boundary between the first display area DA1 and the third display area DA3. Although the boundary between the first display area DA1 and the third display area DA3 is indicated by a straight broken lines in FIG. 9A, the boundary may also be a curved line.

Referring to FIG. 9A, the first pixels PX1 may be disposed in the first display area DA1. As described above, the first pixel PX1 may be an emission area in which light is emitted by the first light-emitting element EU1 of the first display unit DU1. In addition, a first pixel circuit PC1, which is electrically connected to the first light-emitting element EU1 via a contact line CTL, may also be disposed in the first display area DA1.

The third pixels PX3 may be disposed in the third display area DA3. The third pixel PX3 may be an emission area in which light is emitted by the third light-emitting element EU3 of the third display unit DU3. A third pixel circuit PC3, which is electrically connected to the third light-emitting element EU3, may be disposed in the first display area DA1.

A driver may be disposed in the third display area DA3, and thus, a space, in which the third pixel circuit PC3 is to be arranged, may be insufficient in the third display area DA3. In an embodiment, the third pixel circuit PC3 may be disposed not in the third display area DA3 but in a portion of the first display area DA1 adjacent to the third display area DA3. In such an embodiment, some of first light-emitting elements EU1 may include at least a portion overlapping an area in which the third pixel circuit PC3 is disposed so that a blank of the pixel PX is minimized in an area where the third pixel circuit PC3 is disposed in the first display area DA1.

The display apparatus 1 may include a bridge line BL so that the third light-emitting element EU3 disposed in the third display area DA3 is electrically connected to the third pixel circuit PC3 disposed in the first display area DA1. The display apparatus 1 may include a plurality of bridge lines BL, and each of the plurality of bridge lines BL may have a different length based on arrangements of the third light-emitting element EU3 and the third pixel circuit PC3. At least a portion of the bridge line BL may extend toward the third display area DA3 from the first display area DA1.

In such an embodiment, the third pixel circuit PC3 for the third pixels PX3 is disposed in a partial area adjacent to the third display area DA3 in the first display area DA1, and the third pixel circuit PC3 is electrically connected to the third light-emitting element EU3 disposed in the third display area DA3 via the bridge line BL, such that a display area may be expanded to the third display area DA3 in which the driver is arranged.

FIG. 9B illustrates an embodiment of arrangements of a pixel circuit and a light-emitting element with respect to an area adjacent to a boundary between the second display area DA2 and the third display area DA3.

Referring to FIG. 9B, the second pixels PX2 may be disposed in the second display area DA2. The second pixel PX2 may be an emission area in which light is emitted by the second light-emitting element EU2 of the second display unit DU2. In addition, a second pixel circuit PC2, which is electrically connected to the second light-emitting element EU2 via the contact line CTL, may also be disposed in the second display area DA2.

The third pixels PX3 may be disposed in the third display area DA3. As described above, the third pixel PX3 may be an emission area in which light is emitted by the third light-emitting element EU3 of the third display unit DU3. The third pixel circuit PC3, which is electrically connected to the third light-emitting element EU3, may be disposed in the second display area DA2.

The driver may be disposed in the third display area DA3, and thus, a space, in which the third pixel circuit PC3 is to be arranged, may be insufficient in the third display area DA3. In an embodiment, the third pixel circuit PC3 may be disposed not in the third display area DA3 but in a portion of the second display area DA2 adjacent to the third display area DA3. In such an embodiment, some of second light-emitting elements EU2 may include at least a portion overlapping an area in which the third pixel circuit PC3 is disposed so that a blank of the pixel PX is minimized in an area where the third pixel circuit PC3 is disposed in the second display area DA2.

The display apparatus 1 may include the bridge line BL so that the third light-emitting element EU3 disposed in the third display area DA3 is electrically connected to the third pixel circuit PC3 disposed in the second display area DA2. The display apparatus 1 may include a plurality of bridge lines BL, and each of the plurality of bridge lines BL may have a different length based on arrangements of the third light-emitting element EU3 and the third pixel circuit PC3. At least a portion of the bridge line BL may extend toward the third display area DA3 from the second display area DA2.

In such an embodiment, the third pixel circuit PC3 for the third pixels PX3 are disposed in a partial area adjacent to the third display area DA3 in the second display area DA2, and the third pixel circuit PC3 is electrically connected to the third light-emitting element EU3 disposed in the third display area DA3 via the bridge line BL, such that a display area may be expanded to the third display area DA3 in which the driver is arranged.

FIG. 9C illustrates an alternative embodiment of arrangements of a pixel circuit and a light-emitting element with respect to areas adjacent to boundaries between the first to third display areas DA1, DA2, and DA3. Any repetitive detailed description of the same or like elements as those described above with reference to FIGS. 9A and FIG. 9B will be omitted, and different features will be mainly described.

Third light-emitting elements EU3 disposed in the third display area DA3 may include first third light-emitting elements EU3-1 disposed in an area adjacent to the first display area DA1 in the third display area DA3 and second third light-emitting elements EU3-2 disposed in an area adjacent to the second display area DA2 in the third display area DA3.

A first third pixel circuit PC3-1 electrically connected to a first third light-emitting element EU3-1 from among the first third light-emitting elements EU3-1 may be disposed in the first display area DA1, and a second third pixel circuit PC3-2 electrically connected to a second third light-emitting element EU3-2 from among the second third light-emitting elements EU3-2 may be disposed in the second display area DA2. The first third light-emitting element EU3-1 and the first third pixel circuit PC3-1 may constitute a first third display unit DU3-1, and the second third light-emitting element EU3-2 and the second third pixel circuit PC3-2 may constitute a second third display unit DU3-2.

In such an embodiment, one of the first light-emitting elements EU1 may include at least a portion overlapping the first third pixel circuit PC3-1, and one of the second light-emitting elements EU2 may include at least a portion overlapping the second third pixel circuit PC3-2, so that a blank of the pixel PX is minimized in an area where the third pixel circuit PC3 is disposed in the first and second display areas DA1 and DA2.

The display apparatus 1 may include a first bridge line BL1 to electrically connect the first third light-emitting element EU3-1 disposed in the third display area DA3 to the first third pixel circuit PC3-1 disposed in the first display area DA1. In addition, the display apparatus 1 may include a second bridge line BL2 to electrically connect the second third light-emitting element EU3-2 disposed in the third display area DA3 to the second third pixel circuit PC3-2 disposed in the second display area DA2.

At least a portion of the first bridge line BL1 may extend toward the third display area DA3 from the first display area DA1, and at least a portion of the second bridge line BL2 may extend toward the third display area DA3 from the second display area DA2. The display apparatus 1 may include a plurality of first and second bridge lines BL1 and BL2, and each of the plurality of first and second bridge lines BL1 and BL2 may have a different length one from another.

In such an embodiment, the third pixel circuit PC3 for the third pixels PX3 is disposed in the first and second display areas DA1 and DA2, and the third pixel circuit PC3 is electrically connected to the third light-emitting element EU3 via the first and second bridge lines BL1 and BL2, such that a display area may be expanded to the third display area DA3 in which the driver is arranged. Third pixel circuits PC3 are disposed at both sides of the third display area DA3, for example, both a portion of the first display area DA1 adjacent to the third display area DA3 and a portion of the second display area DA2 adjacent to the third display area DA3. Thus, a length of the bridge line BL may be minimized, and an arrangement of a pixel circuit and a bridge line may be simplified.

FIG. 10A to FIG. 10D are each a schematic cross-sectional view of a portion of a display apparatus, according to embodiments. The same reference numerals may represent the same or similar elements as those described above, and any repetitive detailed descriptions thereof may be omitted or simplified.

Figure 10A:
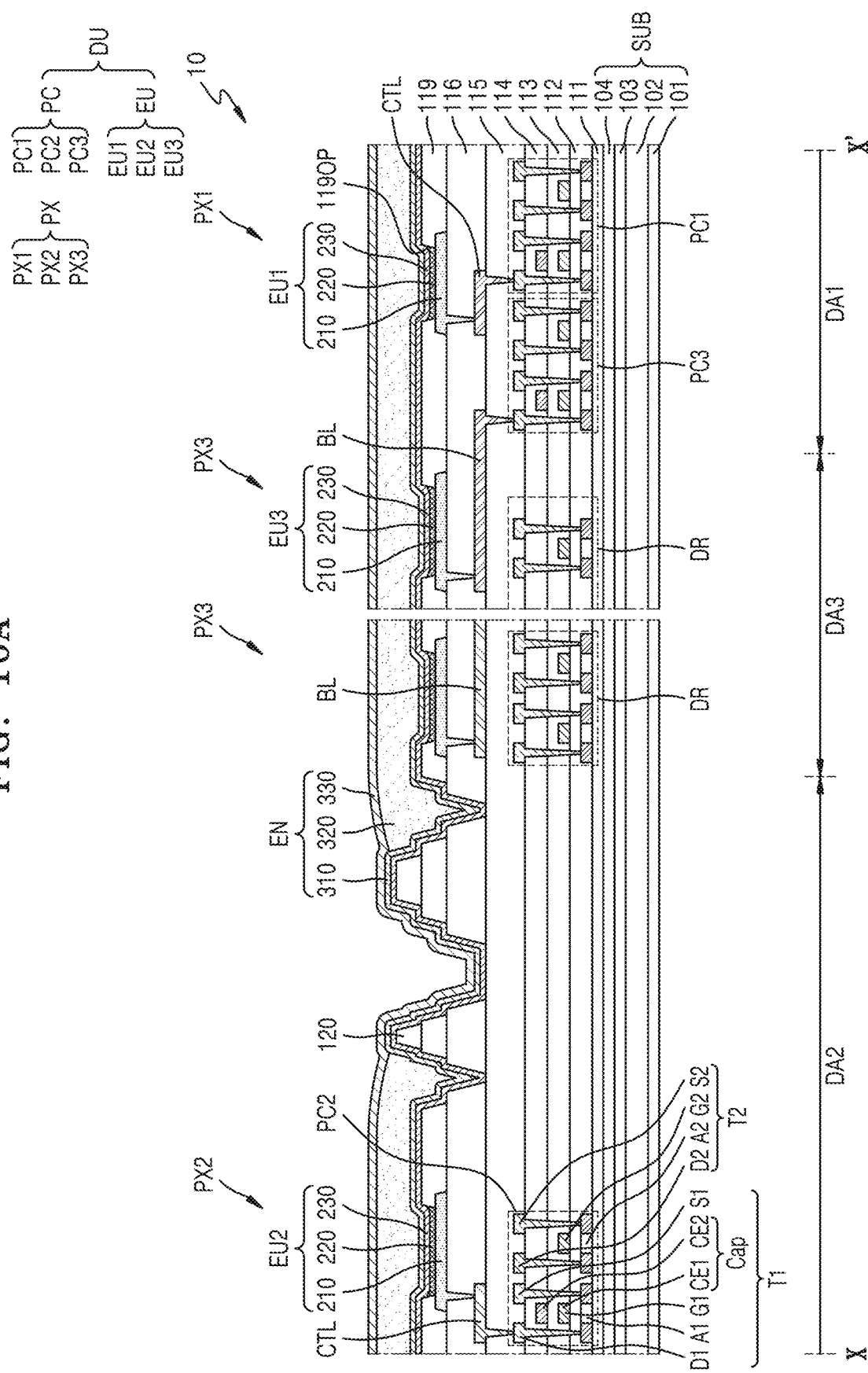
FIGS. 10A to 10D are each a schematic cross-sectional view of a portion of a display apparatus, according to embodiments.

Referring to FIG. 10A, the substrate SUB may have a multi-layer structure including a base layer including a polymer resin and an inorganic layer. In one embodiment, for example, the substrate SUB may include a barrier layer including a polymer resin and a barrier layer of an inorganic insulating layer. In one embodiment, for example, the substrate SUB may include a first base layer 101, a first barrier layer 102, a second base layer 103, and a second barrier layer 104, which are sequentially stacked one on another. In such an embodiment, the first base layer 101 and the second base layer 103 may include, for example, PES, polyacrylate, PEI, PEN, PET, PPS, polyarylate, PI, PCT, or CAP. The first barrier layer 102 and the second barrier layer 104 may each include an inorganic insulation material such as silicon oxide, silicon oxynitride, and/or silicon nitride.

A buffer layer 111 may be disposed on the substrate SUB. The buffer layer 111 may reduce or block foreign substances, moisture, or external air, each penetrating from a lower portion of the substrate SUB, and may provide a flat surface on the substrate SUB. The buffer layer 111 may include an inorganic insulation material such as silicon oxide, silicon oxynitride, or silicon nitride, and may have a single-layer structure or a multi-layer structure, each layer including the material listed above.

The first to third pixel circuits PC1, PC2, and PC3 may be disposed above the buffer layer 111. The first to third pixel circuits PC1, PC2, and PC3 may have a same structure as each other, and may correspond to the pixel circuit PC described above with reference to FIG. 2. The pixel circuit PC may include thin-film transistors and a storage capacitor Cap. Hereinafter, for convenience of description, the second pixel circuit PC2 will be mainly described.

The second pixel circuit PC2 may include the first thin-film transistor T1 and the second thin-film transistor T2. Each of the first thin-film transistor T1 and the second thin-film transistor T2 may include a semiconductor layer A, a gate electrode G overlapping a channel area of the semiconductor layer A, and a source electrode S and a drain electrode D connected to a source area of the semiconductor layer A and a drain area of the semiconductor layer A, respectively. In such an embodiment, the first thin-film transistor T1 may include a first semiconductor layer A1, a first gate electrode G1, a first source electrode S1, and a first drain electrode D1, and the second thin-film transistor T2 may include a second semiconductor layer A2, a second gate electrode G2, a second source electrode S2, and a second drain electrode D2. Hereinafter, for convenience of description, the first and second semiconductor layers A1 and A2, the first and second gate electrodes G1 and G2, the first and second source electrodes S1 and S2, and the first and second drain electrodes D1 and D2 may be referred to as the semiconductor layer A, the gate electrode G, the source electrode S, and the drain electrode D, respectively. A first gate insulating layer 112 may be between the semiconductor layer A and the gate electrode G, and a second gate insulating layer 113 and an insulating interlayer 114 may be between the gate electrode G and the source electrode S or between the gate electrode G and the drain electrode D.

The storage capacitor Cap may include a lower electrode CE1 and an upper electrode CE2 overlapping each other. The lower electrode CE1 and the upper electrode CE2 may be disposed to overlap each other. The lower electrode CE1 may be disposed on the first gate insulating layer 112, and the second gate insulating layer 113 may be between the lower electrode CE1 and the upper electrode CE2. In an embodiment, the storage capacitor Cap may overlap the first thin-film transistor T1, and the first gate electrode G1 of the first thin-film transistor T1 may define or function as the lower electrode CE1 of the storage capacitor Cap. The lower electrode CE1 may include a same material as that of the gate electrode G. The upper electrode CE2 may include a same material as that of the gate electrode G. In addition, the upper electrode CE2 may include a same material as that of the source electrode S or the drain electrode D.

The semiconductor layer A may be disposed on the buffer layer 111. The semiconductor layer A may include the channel area and the source area and the drain area respectively disposed at both sides of the channel area. The semiconductor layer A may have a single layer structure or a multi-layer structure.

The semiconductor layer A may include polysilicon. In an embodiment, the semiconductor layer A may include amorphous silicon. In an embodiment, the semiconductor layer A may include an oxide of at least one material selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layer A may include the channel area, the impurity-doped source area, and the impurity-doped drain area.

The gate electrode G may be disposed above the semiconductor layer A. The gate electrode G may include at least a portion overlapping the semiconductor layer A. The gate electrode G may have a single layer structure or a multi-layer structure, each layer including at least one selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The first gate insulating layer 112, the second gate insulating layer 113, and the insulating interlayer 114 may include, for example, silicon oxide ($SiO_2$), silicon nitride ($SiN_x$), silicon oxynitride (SiON), aluminum oxide ($Actl_2O_3$), titanium oxide ($TiO_2$), tantalum oxide ($Ta_2O_5$), hafnium oxide ($HfO_2$), or zinc oxide ($ZnO_2$).

The source electrode S and the drain electrode D may be disposed on the insulating interlayer 114. The source electrode S and/or the drain electrode D may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may have a single-layer structure or a multi-layer structure, each including the above-listed material. In one embodiment, for example, the source electrode S and/or the drain electrode D may have a three-layer structure of titanium layer/aluminum layer/titanium layer. The source electrode S and the drain electrode D may be electrically connected, via contact holes defined in the first and second gate insulating layers 112 and 113 and the insulating interlayer 114, to the source area of the semiconductor layer A and the drain area of the semiconductor layer A, respectively.

A first planarization layer 115 and a second planarization layer 116, which are sequentially stacked, may be disposed on the insulating interlayer 114. The first and second planarization layers 115 and 116 may each include an organic insulation material and may each have a single layer structure or a multi-layer structure. The first and second planarization layers 115 and 116 may cover the pixel circuit PC to provide a flat upper surface. The first and second planarization layers 115 and 116 may include, for example, a general-purpose polymer such as benzocyclobutene ("BCB"), polyimide, hexamethyldisiloxane ("HMDSO"), polymethylmethacrylate ("PMMA"), or polystyrene ("PS"), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The bridge line BL or the contact line CTL may be disposed on the first planarization layer 115. A pixel electrode 210 may be disposed on the second planarization layer 116. The pixel electrode 210 may be connected, via a contact hole defined in the second planarization layer 116, to the bridge line BL or the contact line CTL, and the bridge line BL or the contact line CTL may be connected, via a contact hole defined in the first planarization layer 115, to the first source electrode S1 of the first thin-film transistor T1 or the first drain electrode D1 of the first thin-film transistor T1. Accordingly, the pixel electrode 210 may be electrically connected to the second pixel circuit PC2.

The bridge line BL or the contact line CTL may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may have a single-layer structure or a multi-layer structure, each layer including the above-listed material.

The pixel electrode 210 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. The pixel electrode 210 may include a reflective film including the above-mentioned material and a transparent conductive film disposed above or/and under the reflective film. The transparent conductive film may include, for example, indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In an embodiment, the pixel electrode 210 may have a three-layer structure of ITO layer/Ag layer/ITO layer, which are sequentially stacked.

A pixel-defining film 119 may be disposed on the pixel electrode 210. The pixel-defining film 119 may cover an edge of the pixel electrode 210 and an opening 119OP may be defined through the pixel-defining film 119 to overlap a central portion of the pixel electrode 210.

The pixel-defining film 119 may prevent generation of an arc or the like at the edge of the pixel electrode 210 by increasing a distance between the edge of the pixel electrode 210 and an opposite electrode 230 above the pixel electrode 210. The pixel-defining film 119 may include an organic insulation material such as a polyimide, polyamide, acryl resin, BCB, HMDSO, and phenolic resin, and may be formed by a method such as a spin coating.

In the second display area DA2, a spacer 120 may be disposed on the pixel-defining film 119. The spacer 120 may be at an edge of a base BS (in FIG. 6A). The spacer 120 may prevent a structure and layers disposed under the spacer 120 from being damaged by a mask used in a process of forming an intermediate layer 220 and the opposite electrode 230. The spacer 120 may include an organic insulation material such as polyimide. The spacer 120 may include a same material as that of the pixel-defining film 119.

The intermediate layer 220, which is formed to correspond to the pixel electrode 210, may be disposed on the pixel-defining film 119. The intermediate layer 220 may be disposed on the pixel electrode 210. The intermediate layer 220 may include an emission layer, and the emission layer may include a polymer organic material or a small molecule organic material, each emitting light having a certain color. In an embodiment, the intermediate layer 220 may include at least one functional layer selected from a hole transport layer ("HTL"), a hole injection layer ("HIL"), an electron transport layer ("ETL"), and an electron injection layer ("EIL"). The functional layer may include an organic material.

The opposite electrode 230 is disposed on the intermediate layer 220. The opposite electrode 230 may include a conductive material having a relatively low work function. In one embodiment, for example, the opposite electrode 230 may include a (semi)transparent layer including, for example, silver (Ag), magnesium (Mg), aluminum (Al), nickel (Ni), chromium (Cr), lithium (Li), calcium (Ca), or an alloy thereof. Alternatively, the opposite electrode 230 may further include a layer such as ITO, IZO, ZnO, or $In_2O_3$ on the (semi)transparent layer including the above-list material. In an embodiment, the opposite electrode 230 may include silver (Ag) and magnesium (Mg). The opposite electrode 230 may be integrally formed to entirely cover the first to third display areas DA1, DA2, and DA3.

A stacked structure of the pixel electrode 210, the intermediate layer 220, and the opposite electrode 230, which are sequentially stacked, may correspond to a light-emitting element EU and may define a light-emitting diode, for example, an organic light-emitting diode OLED. The organic light-emitting diode OLED may emit red, green or blue light, and an emission area of each organic light-emitting diode OLED corresponds to the pixel PX. Because the opening 119OP of the pixel-defining film 119 defines a size and/or width of the emission area, a size and/or width of the pixel PX may depend on a size and/or width of the opening 119OP of the pixel-defining film 119.

A capping layer (not shown) may be disposed on the opposite electrode 230. The capping layer may include LiF. Alternatively, the capping layer (not shown) may include an inorganic insulation material such as silicon nitride and/or an organic insulation material. In an embodiment, the capping layer (not shown) may be omitted.

An encapsulation layer EN may be disposed above the opposite electrode 230. The organic light-emitting diode OLED may be covered with the encapsulation layer EN. The encapsulation layer EN may include first and second inorganic encapsulation layers 310 and 330 and an organic encapsulation layer 320 therebetween.

Each of the first and second inorganic encapsulation layers 310 and 330 may include at least one inorganic insulation material. The inorganic insulation material may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed through a chemical vapor deposition.

The organic encapsulation layer 320 may include a polymer-based material. The polymer-based material may include, for example, an acryl-based resin, an epoxy-based resin, polyimide, and polyehtylene. In one embodiment, for example, the organic encapsulation layer 320 may include an acryl-based resin such as polymethyl methacrylate or polyacrylic acid. The organic encapsulation layer 320 may be formed by hardening a monomer or applying a polymer. The organic encapsulation layer 320 has transparency.

In an embodiment, various functional layers such as a polarization layer for reducing external-light reflection, a black matrix, a color filter, and/or a touch electrode may be provided above the encapsulation layer EN.

The first display unit DU1 including the first pixel circuit PC1 and the first light-emitting element EU1 may be disposed in the first display area DA1. The first pixel circuit PC1 may be electrically connected to the first light-emitting element EU1 via the contact line CTL. The second display unit DU2 including the second pixel circuit PC2 and the second light-emitting element EU2 may be disposed in the second display area DA2. The second pixel circuit PC2 may be electrically connected to the second light-emitting element EU2 via the contact line CTL.

The driver DR may be disposed in the third display area DA3, and the third light-emitting element EU3 may be disposed above the driver DR to overlap the driver DR. The driver DR may include an electric circuit including a thin-film transistor as described above.

In an embodiment, the third pixel circuit PC3 may be disposed in an area adjacent to the third display area DA3 in the first display area DA1, and the third light-emitting element EU3 may be electrically connected to the third pixel circuit PC3 via the bridge line BL. In such an embodiment, at least a portion of the bridge line BL may extend toward the third display area DA3 from the first display area DA1. In such an embodiment, the contact line CTL may extend in a direction perpendicular to a z-axis direction, and thus the first light-emitting element EU1 may include a portion overlapping the third pixel circuit PC3.

Figure 10B:
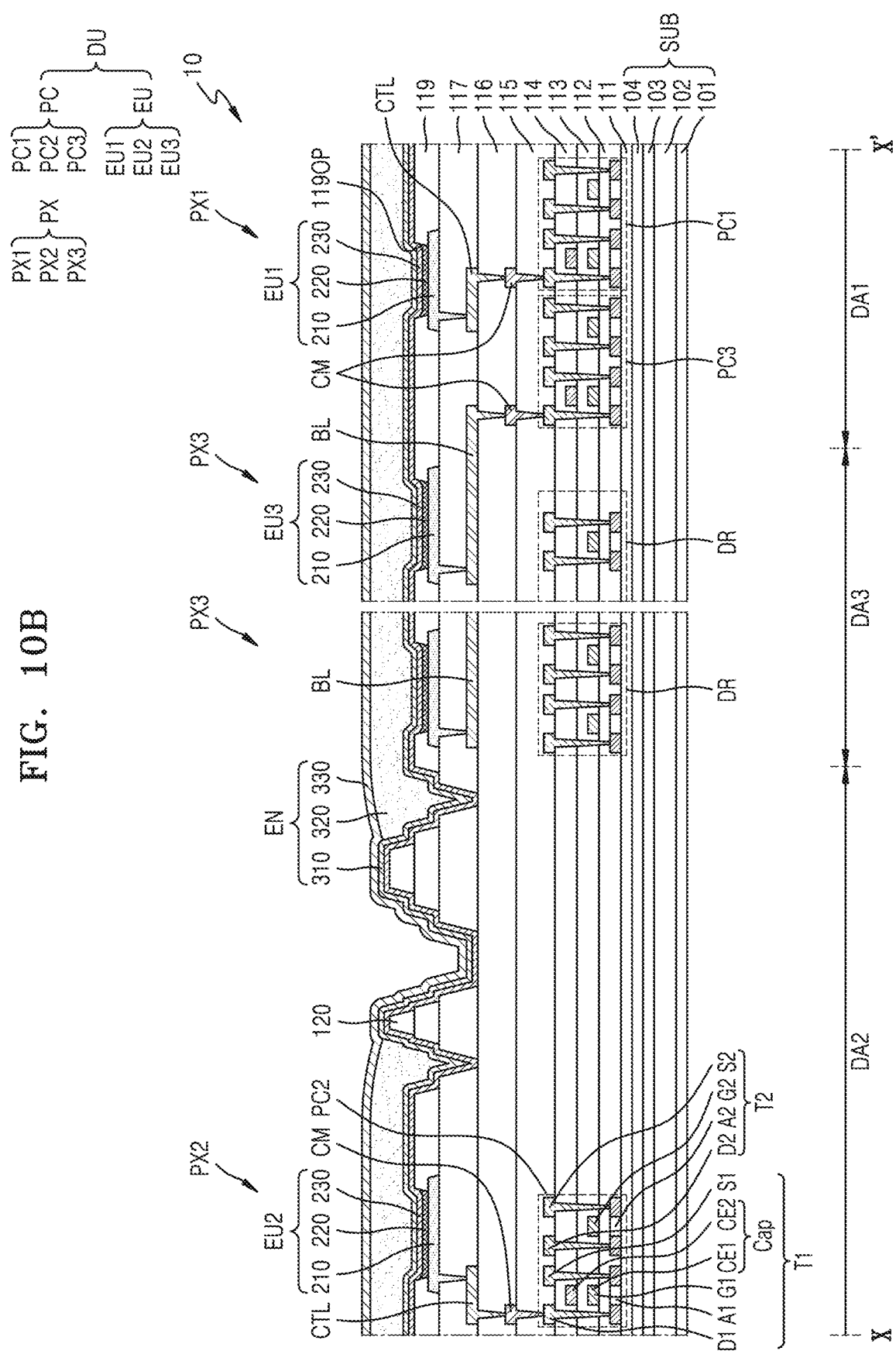

Referring to FIG. 10B, an alternative embodiment of the display apparatus 1 may further include a third planarization layer 117 disposed on the second planarization layer 116 and a contact metal CM disposed on the first planarization layer 115. In such an embodiment, the contact line CTL and the bridge line BL may be disposed on the second planarization layer 116, and the light-emitting element 200 may be disposed on the third planarization layer 117.

The pixel electrode 210 of the light-emitting element 200 may be connected to the contact line CTL or the bridge line BL via a contact hole defined in the third planarization layer 117, and the contact line CTL or the bridge line BL may be electrically connected to the pixel circuit PC via a contact hole formed in the second planarization layer 116 and the contact metal CM.

In such an embodiment, the third planarization layer 117 and the contact metal CM are further included, such that a conductive layer for transmitting an electrical signal to the pixel circuit PC or bridge-connecting between pixel circuits PC or between the pixel circuit PC and the driver DR may be further disposed on the first planarization layer 115.

Figure 10C:
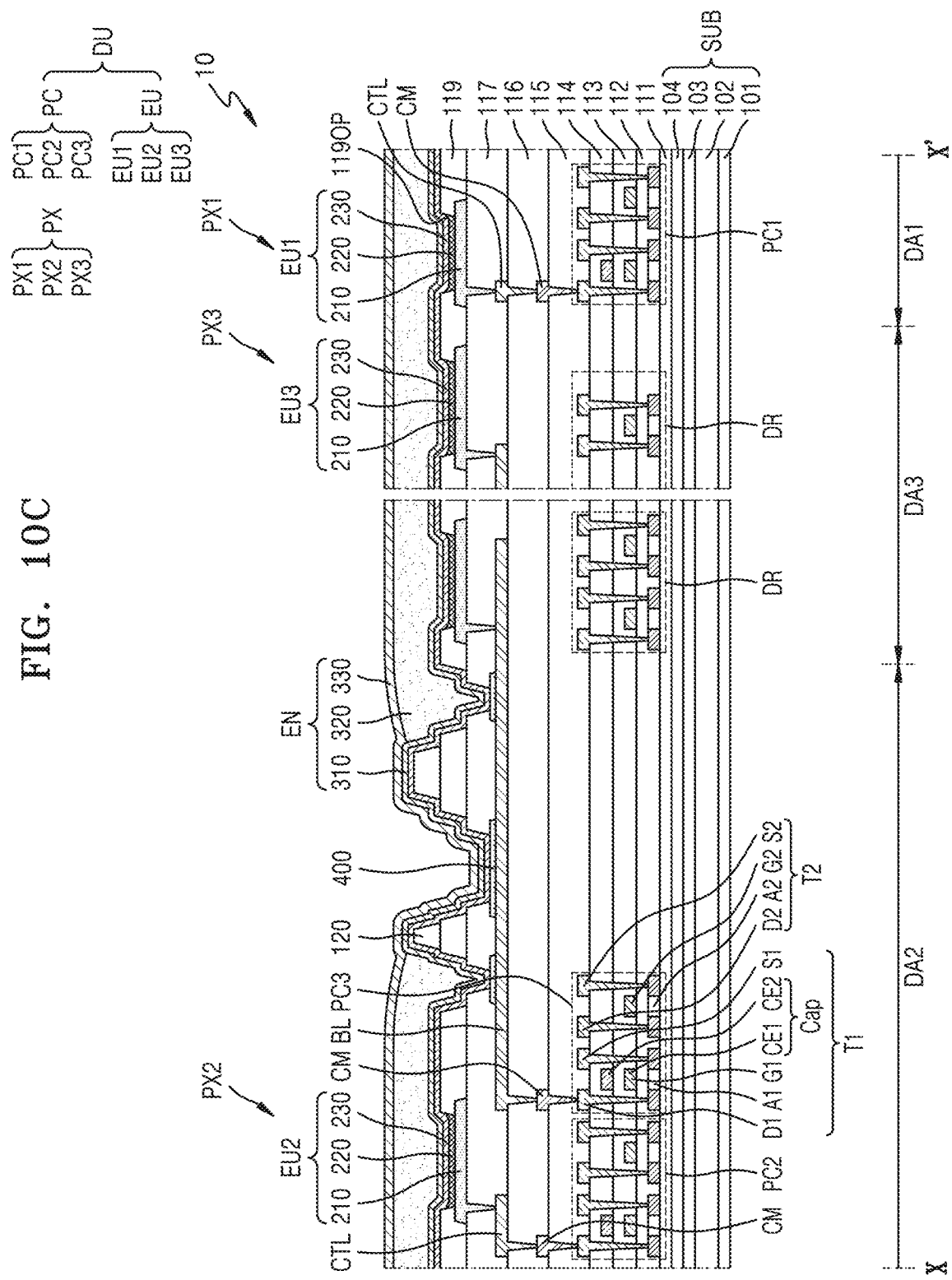

Referring to FIG. 10C, in another alternative embodiment, the third pixel circuit PC3 may be disposed in an area adjacent to the third display area DA3 in the second display area DA2, and the third light-emitting element EU3 may be electrically connected to the third pixel circuit PC3 via the bridge line BL. In such an embodiment, at least a portion of the bridge line BL may extend toward the third display area DA3 from the second display area DA2. The contact line CTL may extend in a direction perpendicular to a z-axis direction, and thus the second light-emitting element EU2 may be disposed to overlap a portion of the third pixel circuit PC3.

An inorganic insulating layer 400 may be between the bridge line BL and the opposite electrode 230 in the second display area DA2. The inorganic insulating layer 400 may include an inorganic insulation material such as silicon nitride, silicon oxide, or silicon oxynitride. The inorganic insulating layer 400 may be insulated so that the bridge line BL and the opposite electrode 230 are not electrically connected to each other.

Figure 10D:
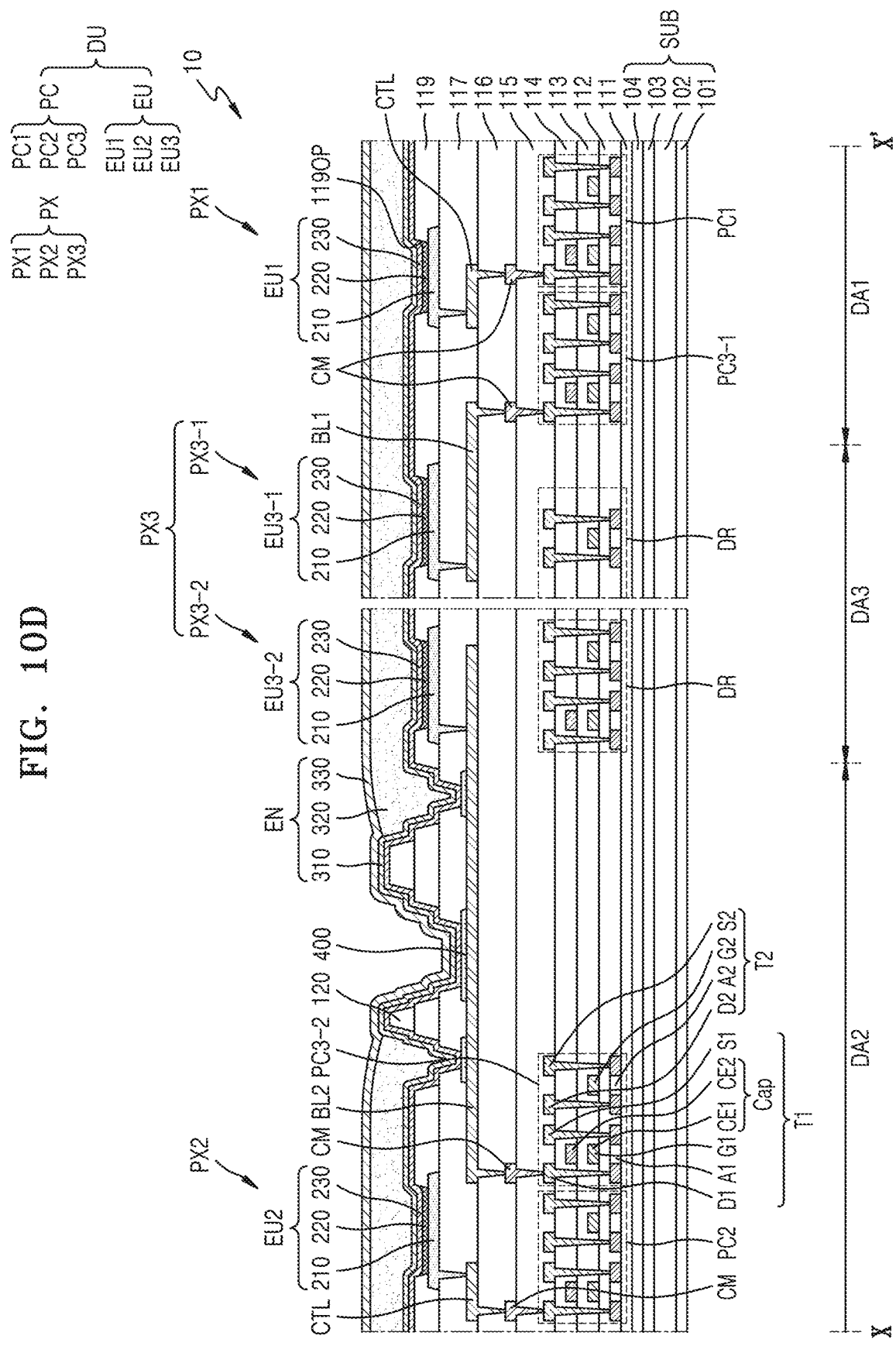

Referring to FIG. 10D, in another alternative embodiment, the first third pixel circuit PC3-1 of the third pixel circuits PC3 may be disposed in an area adjacent to the third display area DA3 in the first display area DA1, and the second third pixel circuit PC3-2 of the third pixel circuits PC3 may be disposed in an area adjacent to the third display area DA3 in the second display area DA2. The first third light-emitting element EU3-1, which is one of the third light-emitting elements EU3, may be electrically connected to the first third pixel circuit PC3-1 via the first bridge line BL1, and the second third light-emitting element EU3-2, which is another one of the third light-emitting elements EU3, may be electrically connected to the second third pixel circuit PC3-2 via the second bridge line BL2. The third light-emitting elements EU3 may be disposed in the third display area DA3. The first third pixel circuit PC3-1 and the first third light-emitting element EU3-1 may constitute the first third display unit DU3-1 (or a first third pixel PX3-1), and the second third pixel circuit PC3-2 and the second third light-emitting element EU3-2 may constitute the second third display unit DU3-2 (or a second third pixel PX3-2).

The first light-emitting element EU1 and the second light-emitting element EU2 may be disposed to overlap a portion of the first third pixel circuit PC3-1 and a portion of the second third pixel circuit PC3-2, respectively, and the contact line CTL may extend in a direction perpendicular to a z-axis direction. In such an embodiment, as described above with reference to FIGS. 10A to 10D, an area in which the driver DR is disposed may also function as the display area DA. Accordingly, the display apparatus 1, in which a non-display area is minimized and the display area DA is increased, may be provided.

According to an embodiment as described above, a display apparatus, in which a display area is expandable to a corner portion and an area of the display area is increased, may be realized.

The invention should not be construed as being limited to the embodiments set forth herein. Rather, these embodiments are provided so that this disclosure will be thorough and complete and will fully convey the concept of the invention to those skilled in the art. For example, a method of manufacturing a display apparatus for manufacturing such display apparatus may also belong to the scope of the disclosure.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display panel comprising:
   a substrate;
   a first display area including a plurality of first pixels;
   a second display area located at a corner of the first display area and including a plurality of second pixels;
   a third display area located between the first display area and the second display area and including a plurality of third pixels;
   a plurality of first display units, a plurality of second display units, and a plurality of third display units, which are disposed on the substrate and correspond to the first to third pixels, respectively; and
   a driver which provides the first to third display units with an electrical signal and having a portion which overlaps the third pixels,
   wherein
   a plurality of slits cut in a direction toward a corner of the substrate from an inner side of the substrate is defined in the substrate at the corner thereof, and
   the substrate comprises a strip portion between two adjacent slits among the slits.

2. The display panel of claim 1, wherein the second pixels are disposed on the strip portion.

3. The display panel of claim 2, wherein a distance between the second pixels is changeable by a force applied to the second display area.

4. The display panel of claim 1, wherein a portion of the substrate in the second display area comprises:
   a base; and a plurality of connectors extending from the base in different directions from each other.

5. The display panel of claim 4, wherein the second pixels are disposed on the base.

6. The display panel of claim 1, wherein each of the first to third display units comprises:
a light-emitting diode; and
a pixel circuit electrically connected to the light-emitting diode, wherein the pixel circuit includes a transistor and a storage capacitor,
wherein the pixel circuit of a third display unit among the third display units is in the first display area or the second display area.

7. The display panel of claim 6, further comprising:
a bridge line connecting the pixel circuit of the third display unit to a light-emitting diode of the third display unit,
wherein the bridge line extends toward the third display area from the first display area or the second display area.

8. The display panel of claim 6, wherein the light-emitting diode of a first display unit among the first display units or the light-emitting diode of a second display unit among the second display units overlaps a portion of the pixel circuit of the third display unit.

9. The display panel of claim 1, wherein each of the first to third display units comprises:
a light-emitting diode; and
a pixel circuit electrically connected to the light-emitting diode, wherein the pixel circuit includes a transistor and a storage capacitor,
wherein the pixel circuit of a first third display unit among the third display units is in the first display area, and
the pixel circuit of a second third display unit among the third display units is in the second display area.

10. The display panel of claim 9, wherein
the light-emitting diode of the first third display unit is disposed in an area adjacent to the first display area in the third display area, and
the light-emitting diode of the second third display unit is disposed in an area adjacent to the second display area in the third display area.

11. The display panel of claim 9, further comprising:
a first bridge line connecting the pixel circuit of the first third display unit to the light-emitting diode of the first third display unit; and
a second bridge line connecting the pixel circuit of the second third display unit to the light-emitting diode of the second third display unit,
wherein the first bridge line and the second bridge line extend toward the third display area from the first display area and the second display area, respectively.

12. The display panel of claim 9, wherein
the light-emitting diode of a first display unit among the first display units includes a portion overlapping the pixel circuit of the first third display unit, and
the light-emitting diode of a second display unit among the second display units includes a portion overlapping the pixel circuit of the second third display unit.

13. A display apparatus comprising:
a substrate;
a first display area which includes a plurality of first light-emitting elements and is partially bent;
a second display area which includes a plurality of second light-emitting elements and is spaced apart from the first display area;
a driver between the first display area and the second display area.

14. The display apparatus of claim 13, wherein the first display area comprises:
a front display area;
a first side display area adjacent to a first edge of the front display area; and
a second side display area adjacent to a second edge of the front display area;
wherein the third display area is adjacent to a corner of the front display area, the first side display area, and the second side display area.

15. The display apparatus of claim 13, wherein
a plurality of, slits cut in a direction toward a corner of the substrate from an inner Side of the substrate is defined in the substrate at the corner thereof; and
the substrate comprises a strip portion between two adjacent slits among the slits.

16. The display apparatus of claim 15, wherein the second light-emitting elements are disposed on the strip portion.

17. The display apparatus of claim 13, wherein a portion of the substrate in the second display area comprises:
a base; and
a plurality of connectors extending from the base in different directions from each other.

18. The display apparatus of claim 17, wherein the second light-emitting elements are disposed on the base.

19. The display apparatus of claim 13, further comprising:
a plurality of first pixel circuits, a plurality of second pixel circuits, and a plurality of third pixel circuits, which are connected to the first to third light-emitting elements, respectively, and each of which includes a transistor and a storage capacitor,
wherein the third pixel circuits are disposed in the first display area or the second display area.

20. The display apparatus of claim 19, wherein
one third pixel circuit of the third pixel circuits is disposed in the first display area, and
another third pixel circuit of the third pixel circuits is disposed in the second display area.

21. The display apparatus of claim 13, wherein a distance between the second light-emitting elements is the same as a distance between the third light-emitting elements.

22. The display apparatus of claim 13, wherein, on a plane, an area of an emission area of a second light-emitting element among the second light-emitting elements is the same as an area of an emission area of a third light-emitting element among the third light-emitting elements.

23. The display apparatus of claim 13, wherein, on a plane, each of an area of an emission area of a second light-emitting element among the second light-emitting elements and an area of an emission area of a third light-emitting element among the third light-emitting elements is greater than an area of an emission area of a first light-emitting element among the first light-emitting elements.

24. The display apparatus of claim 13, further comprising:
a window disposed on the substrate and covering the first light-emitting elements, the second light-emitting elements and the third light-emitting elements.

25. The display panel of claim 13, further comprising:
a third display area including a plurality of third light-emitting elements disposed on the driver.

* * * * *